United States Patent
Yoshimoto et al.

(10) Patent No.: US 8,605,769 B2
(45) Date of Patent: Dec. 10, 2013

(54) SEMICONDUCTOR LASER DEVICE AND MANUFACTURING METHOD THEREOF

(75) Inventors: Susumu Yoshimoto, Osaka (JP); Hideki Matsubara, Osaka (JP); Hirohisa Saitou, Osaka (JP); Takashi Misaki, Osaka (JP); Fumitake Nakanishi, Osaka (JP); Hiroki Mori, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 565 days.

(21) Appl. No.: 11/665,286

(22) PCT Filed: Dec. 6, 2005

(86) PCT No.: PCT/JP2005/022350
§ 371 (c)(1),
(2), (4) Date: Apr. 12, 2007

(87) PCT Pub. No.: WO2006/062084
PCT Pub. Date: Jun. 15, 2006

(65) Prior Publication Data
US 2007/0280318 A1    Dec. 6, 2007

(30) Foreign Application Priority Data
Dec. 8, 2004  (JP) ................... 2004-355728

(51) Int. Cl.
*H01S 3/08* (2006.01)
(52) U.S. Cl.
USPC .............. 372/99; 372/43.01; 372/44.01
(58) Field of Classification Search
USPC .................. 372/43.01, 44.01, 99
See application file for complete search history.

(56) References Cited

U.S. PATENT DOCUMENTS

| 6,366,598 | B1 | 4/2002 | Nichols et al. |
| 6,801,558 | B2 * | 10/2004 | Burak ................. 372/50.11 |
| 6,809,351 | B2 * | 10/2004 | Kuramoto et al. ....... 257/190 |
| 6,812,053 | B1 | 11/2004 | Kong et al. |
| 6,914,715 | B2 * | 7/2005 | Nakazawa et al. ........ 359/321 |

(Continued)

FOREIGN PATENT DOCUMENTS

| CN | 1498427 | 5/2004 |
| CN | 1529915 | 9/2004 |

(Continued)

OTHER PUBLICATIONS

Imada et al., "Coherent two-dimensional lasing action in surface-emitting laser with triangular-lattice photonic crystal structure," Applied Physics Letter 75(3): 316-318 (1999).

(Continued)

*Primary Examiner* — Tod T Van Roy
(74) *Attorney, Agent, or Firm* — Fish & Richardson P.C.

(57) ABSTRACT

A semiconductor laser device includes: a substrate having a principal plane; a photonic crystal layer having an epitaxial layer of gallium nitride formed on substrate in a direction in which principal plane extends and a low refractive index material having a refractive index lower than that of epitaxial layer; an n-type clad layer formed on substrate; a p-type clad layer formed on substrate; an active layer that is interposed between n-type clad layer and p-type clad layer and emits light when a carrier is injected thereinto; and a GaN layer that covers a region directly on photonic crystal layer. Thus, the semiconductor laser device can be manufactured without fusion.

4 Claims, 19 Drawing Sheets

(56) References Cited

U.S. PATENT DOCUMENTS

| | | |
|---|---|---|
| 2002/0126721 A1* | 9/2002 | Kito et al. ............... 372/45 |
| 2002/0197042 A1* | 12/2002 | Kittaka et al. ............ 385/131 |
| 2003/0057444 A1* | 3/2003 | Niki et al. ............... 257/200 |
| 2004/0113166 A1 | 6/2004 | Tadatomo et al. |
| 2004/0218651 A1* | 11/2004 | Iwasaki et al. ........... 372/69 |
| 2004/0247009 A1 | 12/2004 | Noda et al. |
| 2004/0251519 A1 | 12/2004 | Sugahara et al. |
| 2005/0116625 A1* | 6/2005 | Park et al. .............. 313/504 |
| 2005/0152417 A1* | 7/2005 | Lin ...................... 372/43 |

FOREIGN PATENT DOCUMENTS

| | | |
|---|---|---|
| EP | 1411603 A | 4/2004 |
| EP | 1394912 B1 | 2/2009 |
| JP | 57-130455 | 8/1982 |
| JP | 10-284806 | 10/1998 |
| JP | 11-186657 | 7/1999 |
| JP | 2000-236137 | 8/2000 |
| JP | 2000-332351 | 11/2000 |
| JP | 2000-332353 | 11/2000 |
| JP | 2003-023193 | 1/2003 |
| JP | 2003-234502 | 8/2003 |
| JP | 2003-273453 | 9/2003 |
| JP | 2003-273456 | 9/2003 |
| JP | 2004-111766 | 4/2004 |
| JP | 2004-172506 | 6/2004 |
| JP | 2004-228122 | 8/2004 |
| WO | 2004/064212 A | 7/2004 |

OTHER PUBLICATIONS

Tokuda et al., "Wafer Fusion Technique Applied to GaN/GaN System," Jpn. J. Appl. Phys. 39 Part 2 (6B): L572-574 (2000).

Yokoyama et al., "Surface-Emitting Two-Dimensional Photonic Crystal Lasers," J. Jpn. Soc. Infrared Science & Tech. 12(2):17-23 (2003).

* cited by examiner

SEMICONDUCTOR LASER DEVICE AND MANUFACTURING METHOD THEREOF

TECHNICAL FIELD

The present invention relates to a semiconductor laser device and a manufacturing method thereof. In particular, it relates to a semiconductor laser device that includes a two-dimensional diffraction grating having a gallium nitride (GaN) epitaxial layer and a manufacturing method thereof.

BACKGROUND ART

A distributed feedback (DFB) laser is a laser that induces combination of a forward traveling wave and a backward traveling wave by a one-dimensional diffraction grating provided therein and uses a standing wave resulting from the combination. This phenomenon can be caused only by light having a particular wavelength that meets the Bragg condition of the one-dimensional diffraction grating. Therefore, the DFB laser can stably oscillate light whose longitudinal mode (the resonance mode of the oscillated light in the optical axis direction) is the single mode.

On the other hand, in the DFB laser, light in any direction other than the optical axis direction of the light oscillated (in other words, the direction perpendicular to the diffraction grating) does not establish a standing wave even if the light is diffracted by the diffraction grating and, therefore, is not fed back. That is, the DFB laser has a disadvantage that light in any direction other than the optical axis direction of the oscillated light is not involved with the oscillation and lost, and the emission efficiency is reduced accordingly.

Thus, in recent years, development of a two-dimensional photonic crystal laser that has a two-dimensional refractive index distribution has been pursued. The two-dimensional photonic crystal laser has an improved emission efficiency because light propagating in directions other than the optical axis direction of the oscillated light is diffracted by the photonic crystal planes in various directions to establish standing waves. In addition, the two-dimensional photonic crystal laser is characterized in that it provides surface emission in a direction perpendicular to a principal plane of the photonic crystal, and therefore, the laser light output can be increased. For example, a conventional two-dimensional photonic crystal laser has the structure described below.

A two-dimensional photonic crystal laser includes an n-type clad layer, an active layer, a p-type clad layer, an InP substrate, and two electrodes configured so as to form a double-hetero junction. A plurality of holes are formed in a principal plane of the InP substrate in a predetermined lattice arrangement (a triangular lattice, square lattice or the like, for example). Thus, the part of the substrate which contains no holes has a refractive index of InP (n=3.21), and the part which contains the holes has a refractive index of air (n=1), so that the principal plane of the InP substrate constitutes a photonic crystal (two-dimensional diffraction grating) that has a periodic refractive index distribution. On the principal plane of the InP substrate, the n-type clad layer, the active layer and the p-type clad layer are formed in this order. One of the two electrodes is formed on a principal plane of the p-type clad layer, and the other of the two electrodes is formed on the other principal plane of the InP substrate, on which the photonic crystal is not formed.

In such a two-dimensional photonic crystal laser, holes and electrons are injected into the active layer by applying an appropriate voltage between the two electrodes. Then, when the holes and the electrons are recombined, light having a predetermined wavelength is generated in the active layer. Then, this light leaks out of the active layer to become evanescent light, which propagates to the photonic crystal layer and is repeatedly Bragg-reflected at lattice points (that is, holes) in the photonic crystal layer. As a result, standing waves that have same wavelength and same phase are established between lattice points to provide light. Then, this light is oscillated in a direction perpendicular to a principal plane of the photonic crystal.

The conventional two-dimensional photonic crystal laser is manufactured by fabricating a first component having a first InP substrate and a photonic crystal formed thereon and a second component having a second InP substrate and an n-type clad layer, an active layer and a p-type clad layer formed thereon, fusion-applying the photonic crystal on the first InP substrate and the layer on the second InP substrate that is located directly on the photonic crystal (the n-type clad layer or the p-type clad layer), removing the second InP substrate and forming two electrodes.

Conventional two-dimensional photonic crystal lasers are disclosed in the patent document 1 and the non-patent documents 1 and 2, for example. In the patent document 1, a two-dimensional photonic crystal laser is disclosed that has a substrate made of n-type InP and a photonic crystal structure of InGaAs or the like formed on the substrate. Furthermore, in the non-patent document 1, a two-dimensional photonic crystal laser is disclosed that has a substrate made of InP and a photonic crystal of InP formed on the substrate. Furthermore, in the non-patent document 2, a two-dimensional photonic crystal laser is disclosed that has a substrate made of n-type InP and a photonic crystal having a hole. All of these two-dimensional photonic crystal lasers are lasers that oscillate infrared light. Furthermore, in the non-patent document 3, a technique of fusion process of GaN epitaxial layers is disclosed.

Patent Document 1: Japanese Patent Laid-Open No. 2000-332351

Non-Patent Document 1: Mitsuru Yokoyama et al., "Surface-Emitting Two-Dimensional Photonic Crystal Lasers", J. Jpn. Soc. Infrared Science & Technology, vol. 12, No. 2, p 17-23, 2003

Non-Patent Document 2: M. Imada, et al., "Coherent Two-Dimensional Lasing Action in Surface-Emitting Laser with Triangular-Lattice Photonic Crystal", Applied Physics Letters, 75 (3) pp. 316-318, 19 Jul. 1999

Non-Patent Document 3: T. Tokuda, et al., "Wafer Fusion Technique Applied to GaN/GaN System", Jpn. J. Appl. Phys., 39 (2000) Pt. 2, No. 6B pp. L572-L574

DISCLOSURE OF THE INVENTION

Problems to be Solved by the Invention

In recent years, demands for a two-dimensional photonic crystal laser that oscillates light of a short wavelength, such as blue and ultraviolet, have been increased. In order to oscillate light of a short wavelength, such as blue and ultraviolet, a material, such as GaN, that has a band gap in the ultraviolet region has to be used as the photonic crystal. However, if GaN is used as the photonic crystal, when manufacturing the two-dimensional photonic crystal laser, the problems described below arise, for example.

As described above, when manufacturing the two-dimensional photonic crystal laser, the photonic crystal and the layer to be formed directly on the photonic crystal (the n-type clad layer or the p-type clad layer) have to be fabricated separately and then fusion-applied to each other. However, the GaN crystal surface typically has a root-mean-square (RMS) roughness of 2 nm or more, and the flatness of the GaN crystal surface is low. Therefore, the photonic crystal of GaN has a problem that fusion to another layer is difficult. In particular, in the case where a photonic crystal of p-type GaN and a clad layer of p-type GaN are fusion-applied to each other, no ohmic contact is established between the photonic crystal and the clad layer.

In addition, fusion process of the photonic crystal of GaN and the layer to be formed directly on the photonic crystal typically occurs in a reducing atmosphere at a high temperature under a high pressure. Therefore, there is a problem that the device is likely to be damaged, such as distorted, during fusion process.

Thus, an object of the present invention is to provide a semiconductor laser device that can be manufactured without fusion process and a manufacturing method thereof.

Means for Solving the Problems

A semiconductor laser device according to the present invention has: a substrate having a principal plane; a two-dimensional diffraction grating having an epitaxial layer of GaN formed on the substrate in a direction in which the principal plane extends and a low refractive index material having a refractive index lower than that of the epitaxial layer; a first conductive-type clad layer formed on the substrate; a second conductive-type clad layer formed on the substrate; an active layer that is interposed between the first conductive-type clad layer and the second conductive-type clad layer and emits light when a carrier is injected thereinto; and a layer containing GaN that covers a region directly on the two-dimensional diffraction grating.

In the semiconductor laser device according to the present invention, the layer containing GaN covering the region directly on the two-dimensional diffraction grating is epitaxially grown directly on the epitaxial layer. That is, a clad layer or the like can be formed on the two-dimensional diffraction grating without fusion process of the two-dimensional diffraction grating and the layer formed directly on the two-dimensional diffraction grating. Thus, the semiconductor laser device can be manufactured without fusion process.

Preferably, in the semiconductor laser device according to the present invention, the epitaxial layer has a plurality of holes, and the plurality of holes are filled with the low refractive index material to form diffraction grating points.

In this case, the semiconductor laser device oscillates light by establishing a standing wave of light of the TE mode.

Preferably, in the semiconductor laser device according to the present invention, the low refractive index material has a plurality of holes, and the plurality of holes are filled with GaN, which forms the epitaxial layer, to form diffraction grating points.

In this case, the semiconductor laser device oscillates light by establishing a standing wave of light of the TM mode.

Preferably, in the semiconductor laser device according to the present invention, the layer containing GaN covering a region directly on the two-dimensional diffraction grating and the epitaxial layer of GaN constitute one layer or are layers successively epitaxially grown.

Thus, the two-dimensional diffraction grating has a structure in which the top surface and side surface of the low refractive index material is covered with the epitaxial layer.

A manufacturing method of a semiconductor laser device according to an aspect of the present invention includes the following steps. A first conductive-type clad layer, an active layer and a second conductive-type clad layer are formed on a substrate in this order. A low refractive index material having a refractive index lower than that of GaN is deposited in a predetermined pattern on the substrate. After the low refractive index material is deposited, an epitaxial layer of GaN is formed on the substrate (epitaxial layer forming step). After the epitaxial layer forming step, a layer containing GaN is grown in a region directly on the low refractive index material along a principal plane of the substrate.

According to the manufacturing method of a semiconductor laser device according to the aspect of the present invention, after the epitaxial layer of GaN is formed, the layer containing GaN is epitaxially grown on the epitaxial layer in the region directly on the low refractive index material along the principal plane of the substrate. Thus, a two-dimensional diffraction grating composed of the epitaxial layer and the refractive index material, and the layer containing GaN covering the two-dimensional diffraction grating are formed. That is, the layer formed directly on the two-dimensional diffraction grating can be formed on the two-dimensional diffraction grating without fusion process. Thus, the semiconductor laser device can be manufactured without fusion process.

Preferably, in the manufacturing method described above, the first conductive-type clad layer, the active layer and the second conductive-type clad layer are all epitaxially grown.

Thus, the first conductive-type clad layer, the active layer and the second conductive-type clad layer have a good crystalline quality, so that the crystalline quality of the epitaxial layer can be improved in the case where the epitaxial layer is formed at a level higher than the active layer.

Preferably, in the semiconductor laser device and the manufacturing method according to the present invention, the low refractive index material is made of at least one material selected from the group consisting of $SiO_2$, $MgF_2$, $CaF_2$, $BaF_2$, and LiF.

All these materials have a refractive index sufficiently lower than that of the epitaxial layer. By increasing the difference in refractive index between the epitaxial layer and the low refractive index material, the epitaxial layer can be made to effectively serve as a two-dimensional diffraction grating. In addition, the layer containing GaN is hard to grow on these materials compared with on a GaN-based material, and therefore, the layer containing GaN can be selectively grown only on the GaN-based material as a base.

Preferably, in the manufacturing method described above, the pattern of the low refractive index material is a pattern of a plurality of columns. In this case, the two-dimensional diffraction grating has diffraction grating points formed by the low refractive index material, and the semiconductor laser device oscillates light by establishing a standing wave of light of the TE mode.

Preferably, in the manufacturing method described above, the pattern of the low refractive index material is a pattern of a plurality of holes. In this case, the two-dimensional diffraction grating has diffraction grating points constituted by a plurality of columns of the GaN epitaxial layer, and the semiconductor laser device oscillates light by establishing a standing wave of light of the TM mode.

Preferably, in the manufacturing method described above, in the step of growing the layer containing GaN, the layer containing GaN is formed using metal organic chemical vapor deposition. Thus, growth of the layer containing GaN along the principal plane of the substrate is facilitated.

Preferably, in the manufacturing method described above, in the step of growing the layer containing GaN, the layer containing GaN is formed in a state where the ambient pressure is equal to or lower than 90 kPa. Thus, growth of the layer containing GaN along the principal plane of the substrate is facilitated.

A manufacturing method of a semiconductor laser device according to another aspect of the present invention includes the following steps. A first conductive-type clad layer, an active layer and a second conductive-type clad layer are epitaxially grown on a substrate in this order. An epitaxial layer of GaN is formed on the substrate. The epitaxial layer is shaped into a two-dimensional diffraction grating. A layer containing GaN is grown in a region directly on the two-dimensional diffraction grating along a principal plane of the substrate.

According to the manufacturing method of a semiconductor laser device according to this aspect of the present invention, the layer containing GaN is epitaxially grown in the region directly on the two-dimensional diffraction grating along the principal plane of the substrate. In this way, the two-dimensional diffraction grating and the layer containing GaN covering the two-dimensional diffraction grating are formed. That is, the layer formed directly on the two-dimensional diffraction grating can be formed on the two-dimensional diffraction grating without fusion process. Thus, the semiconductor laser device can be manufactured without fusion process.

Preferably, in the manufacturing method of a semiconductor laser device according to this aspect of the present invention, in the step of shaping into the two-dimensional diffraction grating, a plurality of air holes are formed in the epitaxial layer.

In this case, the two-dimensional diffraction grating has diffraction grating points constituted by the plurality of air holes, and the semiconductor laser device oscillates light by establishing a standing wave of light of the TE mode.

Preferably, in the manufacturing method of a semiconductor laser device according to this aspect of the present invention, in the step of shaping into the two-dimensional diffraction grating, the epitaxial layer is shaped into a plurality of columns.

In this case, the two-dimensional diffraction grating has diffraction grating points constituted by the plurality of columns of the epitaxial layer spaced apart from each other by air, and the semiconductor laser device oscillates light by establishing a standing wave of light of the TM mode.

Preferably, in the manufacturing method of a semiconductor laser device according to the present invention, the substrate is made of conductive GaN or conductive SiC (silicon carbide).

If GaN is epitaxially grown on the conductive GaN or conductive SiC, a GaN crystal that has a low dislocation density and a high flatness is produced. Therefore, the dislocation density of the epitaxial layer can be lowered, and the flatness thereof can be improved. In addition, if the substrate used is conductive, an electrode can be attached to the substrate, and a current can be injected through the substrate, so that a current of a high current density can be injected into the active layer.

A manufacturing method of a semiconductor laser device according to further another aspect of the present invention includes the following steps. A first conductive-type clad layer, an active layer and a second conductive-type clad layer are epitaxially grown on a substrate in this order. An epitaxial layer of GaN is formed on the substrate. A plurality of holes are formed in the epitaxial layer. A layer containing GaN is grown in regions directly on the plurality of holes along a principal plane of the substrate using metal organic chemical vapor deposition.

According to the manufacturing method of a semiconductor laser device according to this aspect of the present invention, the layer containing GaN is grown in the regions directly above the plurality of holes along the principal plane of the substrate. In this way, the two-dimensional diffraction grating and the layer containing GaN covering the two-dimensional diffraction grating are formed. That is, the layer formed directly on the two-dimensional diffraction grating can be formed on the two-dimensional diffraction grating without fusion process. Thus, the semiconductor laser device can be manufactured without fusion process.

Preferably, in the manufacturing method of a semiconductor laser device according to this aspect of the present invention, in the step of growing the layer containing GaN, the layer containing GaN is formed in a state where the ambient pressure is equal to or lower than 90 kPa. Thus, growth of the layer containing GaN along the principal plane of the substrate is facilitated, and the regions directly above the plurality of air holes can be readily covered with the layer containing GaN.

Preferably, in the manufacturing method of a semiconductor laser device according to this aspect of the present invention, in the step of growing the layer containing GaN, the layer containing GaN is formed in a state where the ambient pressure is equal to or higher than 10 kPa. Horizontal growth (in a direction parallel to the principal plane of the substrate) of the layer containing GaN is promoted at a reduced ambient pressure. However, by keeping the ambient pressure equal to or higher than 10 kPa, excessive promotion of the horizontal growth can be prevented, and the layer containing GaN can be prevented from being grown on the side surfaces of the holes.

Preferably, the manufacturing method of a semiconductor laser device according to this aspect of the present invention further includes a step of depositing a low refractive index material having a refractive index lower than that of GaN in the plurality of holes after the step of forming the plurality of holes. Thus, the layer containing GaN can be prevented from being grown in the holes. In addition, the diffraction grating points can be formed by the low refractive index material.

Preferably, in the manufacturing method of a semiconductor laser device according to this aspect of the present invention, the step of forming the plurality of holes includes a step of forming a resist on the epitaxial layer excluding the regions in which the plurality of holes are to be formed and a step of etching the epitaxial layer using the resist as a mask. The step of depositing the low refractive index material includes a step of depositing the low refractive index material in the plurality of holes and on the resist by vapor deposition and a step of removing the low refractive index material on the resist along with the resist.

Thus, any excessive low refractive index material on the resist can be removed along with the resist.

Preferably, in the manufacturing method of a semiconductor laser device according to this aspect of the present invention, in the step of depositing the low refractive index material, the low refractive index material is deposited by chemical vapor deposition.

If the chemical vapor deposition is used, the low refractive index material is deposited along the inner wall (side surface and bottom surface) of the holes. Thus, the entire inner wall of the holes can be covered with the low refractive index material, and the layer containing GaN can be prevented from being grown in the holes.

Effects of the Invention

According to a semiconductor laser device and a manufacturing method thereof according to the present invention, a semiconductor laser device can be manufacturing without fusion process.

BRIEF DESCRIPTION OF THE DRAWINGS

FIG. 11 is a schematic diagram illustrating growth of an epitaxial layer in a fifth step of the manufacturing method of the semiconductor laser device according to the embodiment 1 of the present invention, in which FIG. 11(a) shows a first state, FIG. 11(b) shows a second state, FIG. 11(c) shows a third state, FIG. 11(d) shows a fourth state, FIG. 11(e) shows a fifth state, and FIG. 11(f) shows a sixth state;

FIG. 17 is a schematic diagram illustrating growth of an epitaxial layer in a fourth step of the manufacturing method of the semiconductor laser device according to the embodiment 2 of the present invention, in which FIG. 17(a) shows a first state, FIG. 17(b) shows a second state, FIG. 17(c) shows a third state, FIG. 17(d) shows a fourth state, FIG. 17(e) shows a fifth state, and FIG. 17(f) shows a sixth state;

FIG. 22 are schematic diagrams illustrating growth of an epitaxial layer in a third step of the manufacturing method of the semiconductor laser device according to the embodiment 3 of the present invention, in which FIG. 22(a) shows a first state, FIG. 22(b) shows a second state, FIG. 22(c) shows a third state, and FIG. 22(d) shows a fourth state;

DESCRIPTION OF THE REFERENCE SIGNS 1, 1a-1c semiconductor laser device, 2a epitaxial layer, 2b diffraction grating point (low refractive index material, hole), 2c, 2e, 20a hole, 2d groove, 3 substrate, 3a, 3b substrate principal plane, 4, 8a n-type clad layer, 5 active layer, 6, 8 p-type clad layer, 7, 7a photonic crystal layer (two-dimensional diffraction grating), 9 contact layer, 9a light-emitting surface, 10, 11 electrode, 12 GaN layer, 17 photonic crystal layer surface, 18 region directly on low refractive index material, 20 resist, 20b column, 24 film made of low refractive index material.

BEST MODES FOR CARRYING OUT THE INVENTION

In the following, embodiments of the present invention will be described with reference to the drawings.

(Embodiment 1)

Figure 1:
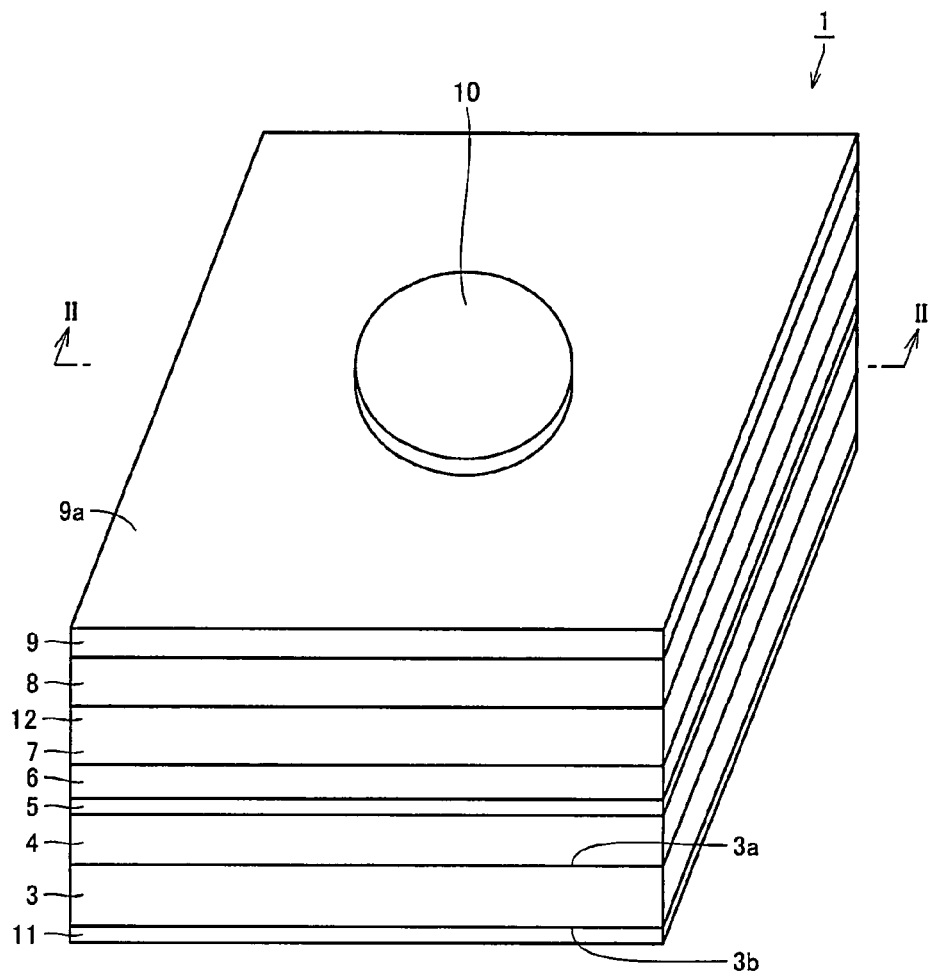
FIG. 1 is a perspective view showing a configuration of a semiconductor laser device according to an embodiment 1 of the present invention.
Figure 2:
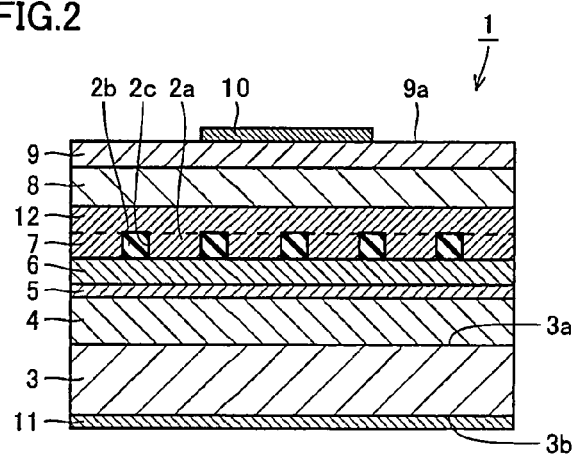
FIG. 2 is a cross-sectional view taken along the II-II line in FIG. 1.

FIG. 1 is a perspective view showing a configuration of a semiconductor laser device according to an embodiment 1 of the present invention. FIG. 2 is a cross-sectional view taken along the line II-II in FIG. 1. As shown in FIGS. 1 and 2, a semiconductor laser device 1 includes a substrate 3, an n-type clad layer 4, an active layer 5, a p-type clad layer 6, a photonic crystal layer 7 serving as a two-dimensional diffraction grating, a GaN layer 12, a p-type clad layer 8, a contact layer 9 and electrodes 10 and 11.

Substrate 3 is made of conductive GaN or conductive SiC, for example, and has principal planes 3a and 3b. N-type clad layer 4 and p-type clad layer 6 are formed on substrate 3, and active layer 5 is interposed between n-type clad layer 4 and p-type clad layer 6. Photonic crystal layer 7 is formed on substrate 3 and extends in a direction in which principal plane 3a extends. Furthermore, photonic crystal layer 7 includes an epitaxial layer 2a and a plurality of diffraction grating points (of a low refractive index material) 2b that have a refractive index that is lower than that of epitaxial layer 2a. Epitaxial layer 2a is made of GaN. In addition, epitaxial layer 2a has a plurality of holes 2c formed therein, and plurality of holes 2c are filled with the low refractive index material. The low refractive index material forms diffraction grating points 2b.

Photonic crystal layer 7 and GaN layer 12 covering photonic crystal layer 7 are both made of GaN and thus constitute one layer (have no boundary therebetween). In the present invention, GaN layer 12 is not an essential layer, and p-type clad layer 8 made of AlGaN, for example, may be formed directly on photonic crystal layer 7.

On substrate 3, n-type clad layer 4, active layer 5, p-type clad layer 6, photonic crystal layer 7, GaN layer 12, p-type clad layer 8 and contact layer 9 are stacked in this order. A circular electrode 10 is provided on contact layer 9, and an electrode 11 is formed covering entire principal plane 3b of substrate 3 that is opposite to principal plane 3a. Electrodes 10 and 11 are made of Au (gold), for example.

Active layer 5 contains GaN and is constituted by a multiple quantum well made of $Al_xGa_{1-x-y}In_yN$ (0≤x, y≤1, 0≤x+y≤1), for example. Active layer 5 may be provided in the form of a plurality of quantum wires formed along photonic crystal layer 7 and extending in a predetermined direction. Alternatively, active layer 5 may be provided in the form of a plurality of quantum boxes formed along photonic crystal layer 7. Each quantum wire has a dimension that provides a discrete electron energy level in two directions perpendicular to the longitudinal direction thereof (for example, on the order of several tens nm). Each quantum box has dimensions that provide a discrete electron energy level in three directions perpendicular to each other (for example, on the order of several tens nm). Such quantum structures result in a higher density of states, so that the light emission efficiency is raised, and the emission spectrum is sharpened.

Figure 3:
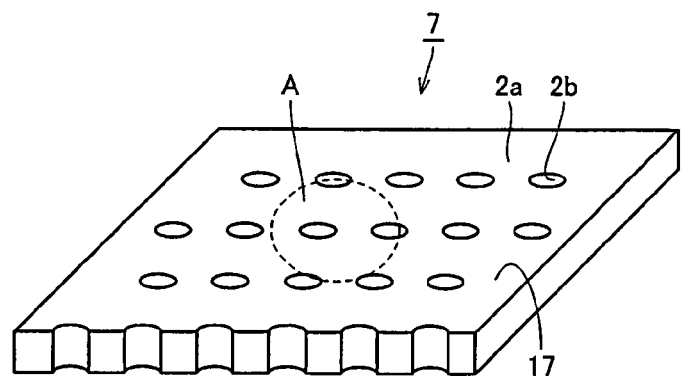
FIG. 3 is a perspective view showing a configuration of a photonic crystal layer according the embodiment 1 of the present invention.

FIG. 3 is a perspective view showing a configuration of the photonic crystal layer according to the embodiment 1 of the present invention. As shown in FIG. 3, in photonic crystal layer 7, a plurality of diffraction grating points 2b are formed on a surface 17 of epitaxial layer 2a to form a triangular lattice. The center of each diffraction grating point 2b is spaced apart from the centers of the closest adjacent six diffraction grating points 2b by equal distances. The distance between the centers of holes is 0.19 μm, for example, and the diameter of each hole 2b is 0.09 μm, for example.

Epitaxial layer 2a has a first refractive index (2.54 in the case of GaN), and the periodically formed diffraction grating points 2b of the low refractive index material have a second refractive index. By increasing the difference between the first and second refractive indices, a desired characteristic of the photonic crystal can be achieved. Low refractive index material 2b may be any material that has a refractive index lower than that of at least epitaxial layer 2a, such as $SiO_2$, $MgF_2$, $CaF_2$, $BaF_2$ and LiF.

Photonic crystal layer 7 is a diffraction grating that has equal periods in a first direction and a second direction at a predetermined angle with respect to the first direction ("period" means a value equivalent to the lattice constant). The two directions and the periods in the respective directions of photonic crystal layer 7 can be chosen in various ways. In addition, a region A of photonic crystal layer 7 directly below electrode 10 (FIG. 1) is a region into which a current of a high current density is injected from electrode 10 and therefore serves as a region that emits light. A light emission method of semiconductor laser device 1 will be described later.

With reference to FIGS. 1 and 2, n-type clad layer 4 is made of n-type AlGaN, for example, and p-type clad layer 6 is made of p-type AlGaN, for example. N-type clad layer 4 and the p-type clad layer 6 serve as conductive layers that conduct carriers that are to be supplied to active layer 5. Thus, n-type clad layer 4 and p-type clad layer 6 are disposed with active layer 5 interposed therebetween. In addition, n-type clad layer 4 and p-type clad layer 6 both serve as confinement layers that confine carriers (electrons and holes) and light in active layer 5. That is, n-type clad layer 4, active layer 5 and p-type clad layer 6 form a double hetero junction. Consequently, carriers that contribute to light emission can be concentrated in active layer 5.

In addition, p-type clad layer 6 serves as a block layer that prevents electrons from entering photonic crystal layer 7. Consequently, it is possible to suppress nonradiative recombination of electrons and holes in photonic crystal layer 7.

P-type clad layer 8 is made of p-type AlGaN, for example. P-type clad layer 8 serves as a conductive layer that conducts carriers that are to be supplied to active layer 5. In addition, p-type clad layer 8 serves as a confinement layer that confines carriers (electrons) and light in a layer disposed below photonic crystal layer 7. Furthermore, contact layer 9 is formed to provide an ohmic contact with electrode 10.

For purposes of illustration, dimensions of components of semiconductor laser device 1 according to this embodiment will be listed below. For example, substrate 3 has a thickness of 100 μm, photonic crystal layer 7 has a thickness of 0.1 μm, n-type clad layer 4 and p-type clad layer 8 each have a thickness of 0.5 μm, and active layer 5 and p-type clad layer 6 have a thickness of 0.1 μm.

Now, a light emission method of semiconductor laser device 1 will be described with reference to FIGS. 1 to 3.

When a positive voltage is applied to electrode 10, holes are injected from p-type clad layers 6 and 8 into active layer 5, and electrons are injected from n-type clad layer 4 into active layer 5. Once the holes and electrons (carriers) are injected into active layer 5, the carriers are recombined to emit light. The wavelength of the emitted light depends on the band gap of the semiconductor layer of active layer 5.

The light emitted in active layer 5 is confined in active layer 5 by n-type clad layer 4 and p-type clad layer 6. However, part of the light reaches photonic crystal layer 7 as evanescent light. If the wavelength of the evanescent light having reached photonic crystal layer 7 corresponds with a predetermined period of photonic crystal layer 7, a standing wave having a wavelength corresponding to the period is induced.

Such a phenomenon can occur in region A and a surrounding area centered on electrode 10, because active layer 5 and photonic crystal layer 7 are formed to extend two-dimensionally. A feedback effect due to the standing wave allows laser oscillation.

Now, two-dimensional diffraction grating (photonic crystal layer) 7 will be described with reference to a specific example. The two-dimensional diffraction grating has a characteristic structure that can be translated in at least two directions at the same period to match with the structure before the translation. Such a two-dimensional diffraction grating is composed of regular triangles, squares, or regular hexagons arranged without any gap with lattice points set at the vertexes thereof. In this specification, the grating composed of regular triangles is referred to as triangular lattice, the grating composed of squares is referred to as square lattice, and the grating composed of regular hexagons is referred to as hexagonal lattice.

Figure 4:
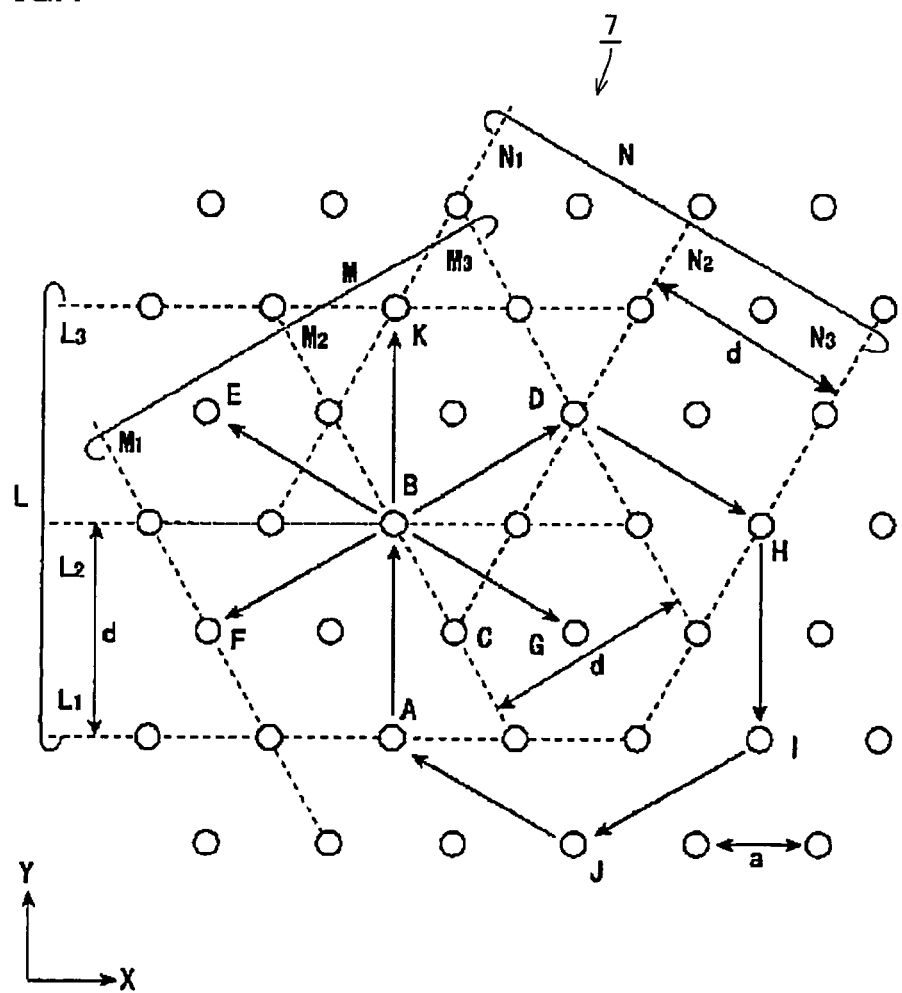
FIG. 4 is a diagram showing a triangular lattice having a lattice constant of "a" that serves as a two-dimensional diffraction grating.

FIG. 4 is a diagram showing a triangular lattice having a lattice constant of "a" that serves as a two-dimensional diffraction grating. The triangular lattice is filled with regular triangles whose sides have a length of "a". In FIG. 4, a lattice point A is arbitrarily selected, and direction from lattice point A toward a lattice point B is referred to as X-Γ direction, and the direction from lattice point A toward a lattice point C is referred to as X-J direction. With regard to this embodiment, a case where the wavelength of the light emitted in active layer 5 corresponds with the period of the lattice in X-Γ direction will be described.

Two-dimensional diffraction grating 7 can be considered to include three one-dimensional diffraction grating groups L, M and N described below. One-dimensional diffraction grating group L is composed of one-dimensional gratings $L_1$, $L_2$, $L_3$ and the like that are arranged in the Y-axis direction. One-dimensional diffraction grating group M is composed of one-dimensional gratings $M_1$, $M_2$, $M_3$ and the like that are arranged in a direction at an angle of 120 degrees with respect to the X-axis direction. One-dimensional diffraction grating group N is composed of one-dimensional gratings $N_1$, $N_2$, $N_3$ and the like that are arranged in a direction at an angle of 60 degrees with respect to the X-axis direction. These three one-dimensional diffraction grating groups L, N and M match with each other if rotated 120 degrees about any lattice point. In each of one-dimensional diffraction grating groups L, N and M, the distance between adjacent two one-dimensional gratings is "d", and the distance between adjacent two lattice points in each one-dimensional grating is "a".

First, grating group L will be considered. Light traveling in a direction from lattice point A to lattice point B is diffracted at lattice point B. The direction of diffraction is defined by the Bragg condition $2d^* \sin \theta = m\lambda$ (m=0, ±1, ...). Here, λ indicates the wavelength of the light in epitaxial layer 2a. In the case where the diffraction grating is configured to provide the second-order Bragg reflection (m=±2), there exist other lattice points D, E, F and G at positions where θ=±60 degrees and ±120 degrees. In addition, at positions where θ=0 degrees and 180 degrees, which correspond to a case where m=0, lattice points A and K exist.

For example, light diffracted at lattice point B toward lattice point D is diffracted according to the rule in grating group M. This diffraction can be considered in the same manner as the diffraction according to the rule in grating group L. Then, light diffracted at lattice point D toward a lattice point H is diffracted according to rule in grating group N. In this way, light is diffracted successively at lattice point H, a lattice point I and a lattice point J. Light diffracted at lattice point J toward lattice point A is diffracted according to the rule in grating group N.

As described above, the light traveling from lattice point A to lattice point B reaches initial lattice point A after a plurality of diffractions. Thus, in semiconductor laser device 1, since light traveling in a certain direction returns to the position of the initial lattice point after a plurality of diffractions, standing waves are established between the lattice points. Therefore, two-dimensional diffraction grating 7 serves as an optical resonator, that is, a wavelength selector and a reflector.

Furthermore, in the Bragg condition $2d^* \sin \theta = m\lambda$ (m=0, ±1, ...), if "m" is an odd number, Bragg reflection occurs in directions of θ=±90 degrees. This means that strong diffraction occurs also in a direction perpendicular to the principal plane of two-dimensional diffraction grating 7 (a direction perpendicular to the plane of the sheet of FIG. 4). Thus, light can be emitted in a direction perpendicular to the principal plane of two-dimensional diffraction grating 7, that is, can be emitted from the light-emitting surface 9a (FIG. 1) (surface emission can be achieved).

Furthermore, in two-dimensional diffraction grating 7, taking into account the fact that lattice point A at which the phenomenon described above occurs is arbitrarily chosen, the light diffraction described above can occur at all the lattice points arranged two-dimensionally. Therefore, it can be considered that rays of light propagating in X-Γ directions of the respective grating groups are two-dimensionally combined to each other by Bragg diffraction. It can be considered that, in two-dimensional diffraction grating 7, three X-Γ directions are combined by such two-dimensional combination to provide a coherent state.

Figure 5:
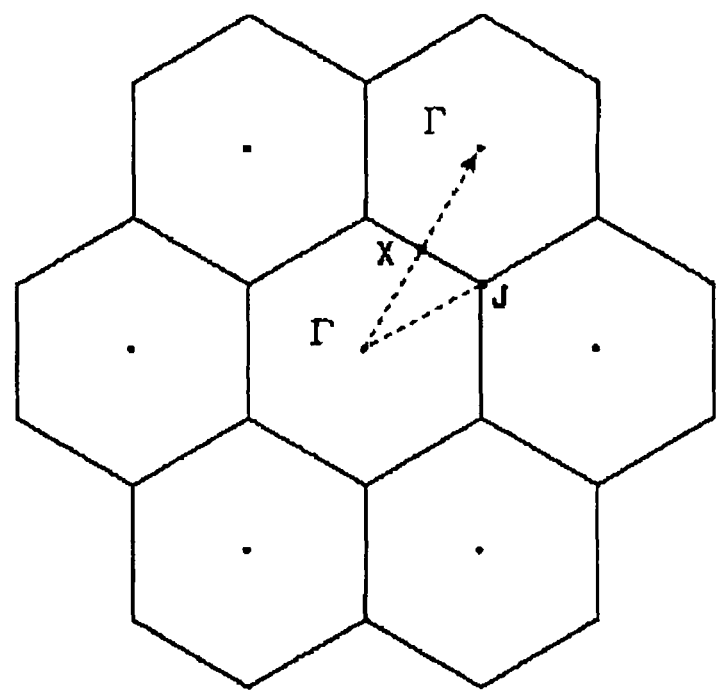
FIG. 5 is a diagram showing a reciprocal space of the triangular lattice shown in FIG. 4.

FIG. 5 is a diagram showing a reciprocal space of the triangular lattice shown in FIG. 4. There are shown a Γ point that is the central point of a brillouin zone in the reciprocal space, an X point at which a line connecting Γ point of a brillouin zone and Γ point of an adjacent brillouin zone intersects with a boundary between the brillouin zones, and a J point at which three adjacent brillouin zones abut on each other. Directions defined by Γ point, X point and J point in FIG. 5 correspond to Γ-X direction and Γ-J direction that have been referred to in the description with reference to FIG. 4.

Figure 6:
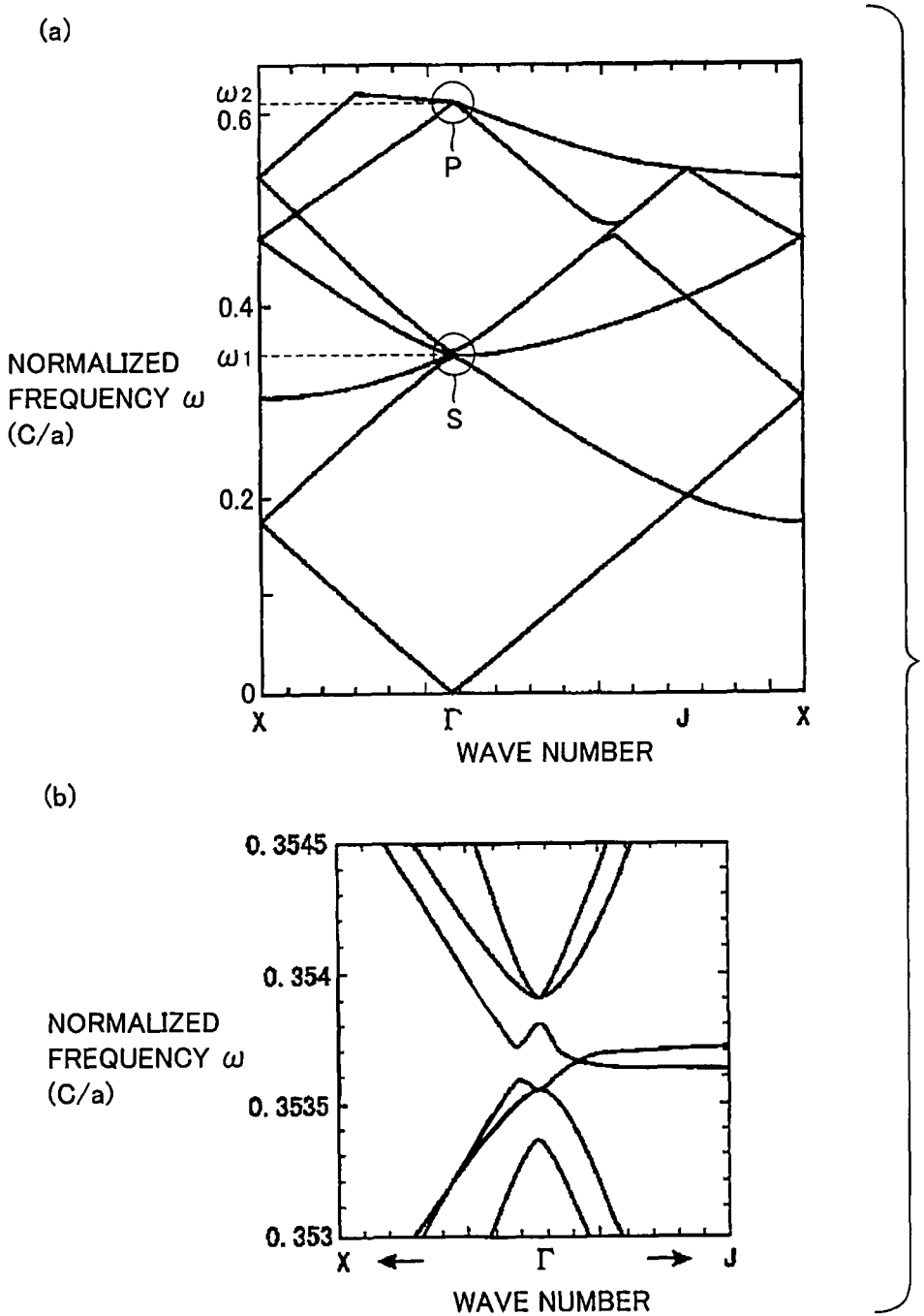
FIG. 6(a) is a photonic band diagram showing a result of band calculation for the photonic crystal layer made of InP having the triangular lattice structure shown in FIG. 4 performed according to the plane wave expansion method and showing, in particular, a calculation result concerning the TE mode.
FIG. 6(b) is an enlarged diagram of a region in the vicinity of an S point shown in FIG. 6(a)

FIG. 6(a) is a photonic band diagram showing a result of band calculation for the photonic crystal layer made of InP having the triangular lattice structure shown in FIG. 4 performed according to the plane wave expansion method. In particular, FIG. 6(a) shows a calculation result concerning the TE mode. FIG. 6(b) is an enlarged diagram of a region in the vicinity of an S point shown in FIG. 6(a). Photonic crystal layer 7 shown in FIG. 1 has a dispersion relationship shown in FIG. 6(a), that is, has a photonic band structure. In this specification, the "photonic band structure" means a dispersion relationship defined for photon energy based on an at least two-dimensional periodic refractive index distribution formed in a medium.

With reference to FIGS. 6(a) and 6(b), in a wave number range at Γ point and in the vicinity thereof, photonic band gaps exist at regions indicated by reference characters "S" and "P". Here, the region indicated by reference character "S" is referred to as a first photonic band gap, and the region indicated by reference character "P" is referred to as a second photonic band gap. A normalized frequency $\omega_1$ of the first photonic band gap is about 0.35, and a normalized frequency $\omega_2$ of the second photonic band gap is about 0.61. Here, since Γ point is a point at which the wave number vector k=0, if normalized frequency ω of the light is normalized frequencies $\omega_1$ and $\omega_2$, a standing wave is established without regard to the crystal orientation. If similar calculation is performed on the photonic crystal (triangular lattice) made of GaN according to this application, normalized frequency $\omega_1$ of the first photonic band gap is about 0.47, and normalized frequency $\omega_2$ of the second photonic band gap is about 0.82.

Now, a manufacturing method of semiconductor laser device 1 according to this embodiment will be described with reference to FIGS. 7 to 12.

Figure 7:
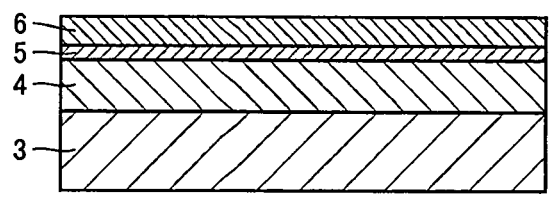
FIG. 7 is a diagram illustrating a first step of a manufacturing method of the semiconductor laser device according to the embodiment 1 of the present invention.

First, referring to FIG. 7, a substrate 3 made of conductive GaN or conductive SiC, for example, is prepared. Then, using the metal-organic chemical vapor deposition (MOCVD) method, for example, an n-type clad layer 4, an active layer 5 and a p-type clad layer 6 are epitaxially grown on substrate 3 in this order. Although not shown, a buffer layer may be formed directly on substrate 3, and n-type clad layer 4 may be formed on the buffer layer.

Figure 8:
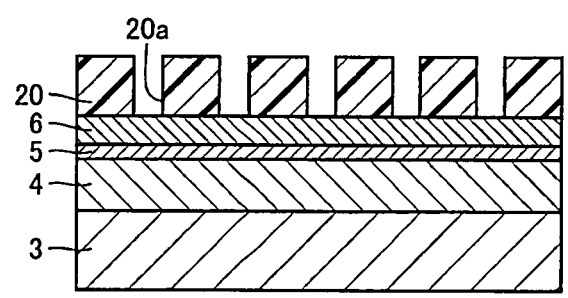
FIG. 8 is a diagram illustrating a second step of the manufacturing method of the semiconductor laser device according to the embodiment 1 of the present invention.

Then, referring to FIG. 8, a resist 20 having a predetermined pattern (a patterned layer) is formed on p-type clad layer 6 by the electron-beam lithography technique. In FIG. 8, resist 20 has a pattern of a plurality of holes 20a arranged in a triangular lattice structure.

Figure 9:
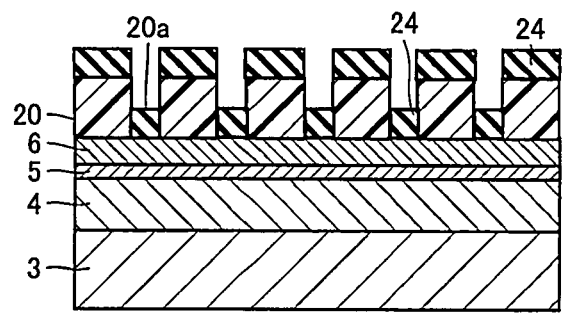
FIG. 9 is a diagram illustrating a third step of the manufacturing method of the semiconductor laser device according to the embodiment 1 of the present invention.
Figure 10:
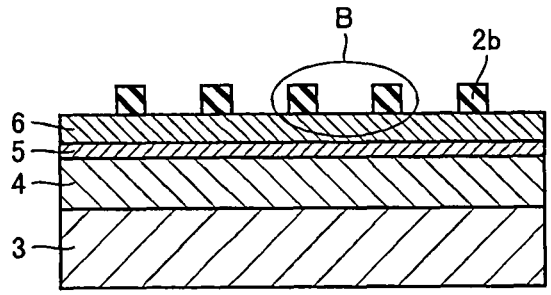
FIG. 10 is a diagram illustrating a fourth step of the manufacturing method of the semiconductor laser device according to the embodiment 1 of the present invention.
Figure 11:
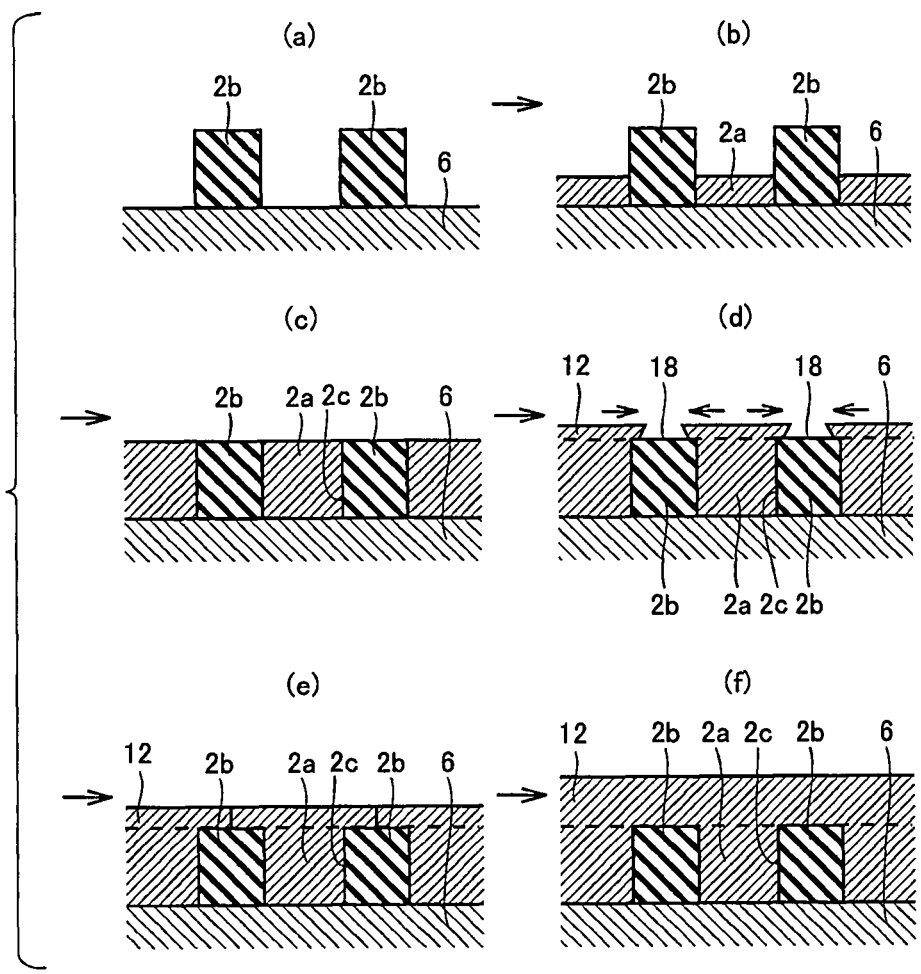

Then, referring to FIG. 9, a film 24 of a low refractive index material is formed on resist 20 by vapor deposition to fill plurality of holes 20a with the low refractive index material. Then, referring to FIG. 10, film 24 formed on resist 20 is removed (lifted off) along with resist 20. Thus, a plurality of columns of low refractive index material 2b arranged in a triangular lattice structure are left on p-type clad layer 6.

Then, the surface of p-type clad layer 6 is cleaned, and then, an epitaxial layer 2a made of GaN and a GaN layer 12 are formed on p-type clad layer 6 by MOCVD. FIGS. 11(a) to 11(f) are schematic diagrams sequentially illustrating the growth of the epitaxial layer according to the embodiment 1 of the present invention. Here, FIG. 11(a) is an enlarged view of a B portion shown in FIG. 10.

Referring to FIGS. 11(a) to 11(f), GaN is epitaxially grown under a condition in which the ratio of a group V material gas to a group III material gas is higher than that in the typical GaN epitaxial growth condition, that is, under a condition in which a larger amount of ammonia gas is contained. Then, GaN is not epitaxially grown on the top and side surfaces of low-refractive-index-material columns 2b, but GaN (epitaxial layer 2a) is selectively epitaxially grown only on the exposed surface of p-type clad layer 6 ((a)→(b)). GaN is grown upwardly in the drawings to reach the upper ends of low-refractive-index-material columns 2b ((b)→(c)). In this way, a photonic crystal layer 7 (FIG. 1) is provided that has a structure in which a plurality of holes 2c in epitaxial layer 2a are filled with low refractive index material 2b.

Figure 12:
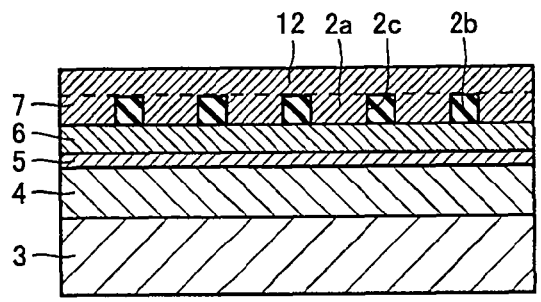
FIG. 12 is a diagram illustrating a sixth step of the manufacturing method of the semiconductor laser device according to the embodiment 1 of the present invention.

Once reached the upper ends of low-refractive-index-material columns 2b, GaN (the GaN layer 12) is grown in regions 18 directly on low-refractive-index-material columns 2b in a horizontal direction in the drawings ((c)→(d)). The direction of growth of GaN is along a principal plane 3a of substrate 3 (FIG. 1). Then, once regions 18 directly on low-refractive-index-material columns 2b are completely covered with GaN, GaN layer 12 is grown upwardly in the drawings again ((d)→(e)→(f)). In this way, GaN layer 12 is formed. FIG. 12 shows a state after photonic crystal layer 7 and GaN layer 12 are formed on p-type clad layer 6.

As described above, by adjusting the condition of epitaxial growth of GaN, GaN layer 12 can be formed on photonic crystal layer 7 without fusion.

Here, in order to grow the layer (GaN layer 12 in the drawings) covering photonic crystal layer 7 horizontally in the drawings as shown in FIGS. 11(c) to 11(e), the layer covering photonic crystal layer 7 preferably contains any of Ga, In and Al and N. In addition, in order to grow the layer covering photonic crystal layer 7 horizontally in the drawings, the layer covering photonic crystal layer 7 is formed at an ambient pressure that is equal to or lower than 90 kPa, or preferably, equal to or lower than 70 kPa.

While a structure in which epitaxial layer 2a covers the regions directly on low-refractive-index-material columns 2b has been illustrated with regard to this embodiment, the present invention is not limited to such a structure. For example, when epitaxial layer 2a reaches the upper ends of low-refractive-index-material columns 2b (at the time of FIG. 11(c)), the epitaxial growth condition may be changed to continuously grow a p-type clad layer 8 containing GaN (a p-type clad layer 8 made of AlGaN, for example). In this case, regions 18 directly on low-refractive-index-material columns 2b are covered with p-type clad layer 8. The same applies to an embodiment 2 described later.

Then, referring to FIG. 2, a p-type clad layer 8 and a contact layer 9 are epitaxially grown on GaN layer 12 in this order by MOCVD, for example. Then, an electrode 10 is formed on a light-emitting surface 9a of contact layer 9, and an electrode 11 is formed on a principal plane 3b of substrate 3, thereby completing semiconductor laser device 1.

Semiconductor laser device 1 according to this embodiment has substrate 3 having principal plane 3a, epitaxial layer 2a made of GaN formed on substrate 3 along the direction in which principal plane 3a extends, photonic crystal layer 7 containing low refractive index material 2b having a refractive index lower than that of epitaxial layer 2a, n-type clad layer 4 formed on substrate 3, p-type clad layer 6 formed on substrate 3, active layer 5 that is interposed between n-type clad layer 4 and p-type clad layer 6 and emits light when a carrier is injected thereinto, and GaN layer 12 covering photonic crystal layer 7.

In semiconductor laser device 1 according to this embodiment, GaN layer 12 covering photonic crystal layer 7 is epitaxially grown directly on epitaxial layer 2a. That is, the layer covering photonic crystal layer 7 can be formed directly on photonic crystal layer 7 without fusion. Thus, the semiconductor laser device can be manufactured without fusion.

In addition, in semiconductor laser device 1 according to this embodiment, since the diffraction grating points are made of low refractive index material 2b, nonradiative recombination of carriers at the interfaces between epitaxial layer 2a and the diffraction grating points is hard to occur compared with the case where the diffraction grating points are made of air. Therefore, the property of the semiconductor laser device can be improved.

Furthermore, in semiconductor laser device 1 according to this embodiment, since the diffraction grating points are made of low refractive index material 2b, unlike the case where the diffraction grating points are made of air, moisture or other impurities in the air can be prevented from entering the inside of the device or remaining in the device. Therefore, the reliability of the semiconductor laser device can be improved.

In semiconductor laser device 1 according to this embodiment, epitaxial layer 2a has a plurality of holes 2c, and plurality of holes 2c are filled with low refractive index material 2b to form the diffraction grating points.

Thus, the semiconductor laser device is provided that oscillates light by establishing a standing wave of light of the TE mode.

In semiconductor laser device 1 according to this embodiment, GaN layer 12 and epitaxial layer 2a constitute one layer or are layers successively epitaxially grown.

Thus, photonic crystal layer 7 is provided that has a structure in which the top and side surfaces of low-refractive-index-material columns 2b are covered with the epitaxial layer.

The manufacturing method of semiconductor laser device 1 according to this embodiment includes the following steps. N-type clad layer 4, active layer 5, and p-type clad layer 6 are formed on substrate 3 in this order. Film 24 of low refractive index material 2b having a refractive index lower than that of GaN that has a predetermined pattern is formed on substrate 3. After film 24 is formed, epitaxial layer 2a of GaN is formed on substrate 3 (an epitaxial layer forming step). After the epitaxial layer forming step, GaN layer 12 is grown along principal plane 3a of substrate 3 in region 18 directly on low refractive index material 2b.

In the manufacturing method of semiconductor laser device 1 according to this embodiment, after epitaxial layer 2a of GaN is formed, GaN layer 12 is epitaxially grown on epitaxial layer 2a and then grown along principal plane 3a of substrate 3 in region 18 directly on low refractive index material 2b. In this way, photonic crystal layer 7 and GaN layer 12 covering photonic crystal layer 7 are formed. That is, the layer covering photonic crystal layer 7 can be formed directly on photonic crystal layer 7 without fusion. Thus, the semiconductor laser device can be manufactured without fusion.

In the manufacturing method described above, n-type clad layer 4, active layer 5 and p-type clad layer 6 are all grown epitaxially.

Thus, n-type clad layer 4, active layer 5 and p-type clad layer 6 have an improved crystalline quality, so that crystalline quality of epitaxial layer 2a can be improved in the case where epitaxial layer 2a is formed at a level higher than active layer 5.

In semiconductor laser device 1 and the manufacturing method thereof according to this embodiment, low refractive index material 2b is $SiO_2$, $MgF_2$, $CaF_2$, $BaF_2$ or LiF.

All these materials have a refractive index sufficiently lower than that of epitaxial layer 2a. By increasing the difference in refractive index between epitaxial layer 2a and low refractive index material 2b, the photonic crystal layer having a good property can be formed. In addition, GaN layer 12 is hard to grow on these materials compared with on epitaxial layer 2a, and thus, GaN layer 12 can be selectively grown only on epitaxial layer 2a.

In the manufacturing method described above, resist 20 preferably has a pattern of a plurality of holes 20a. Thus, photonic crystal layer 7 that has diffraction grating points made of low refractive index material 2b can be provided, and the semiconductor laser device that oscillates light by establishing a standing wave of light of the TE mode can be provided.

In semiconductor laser device 1 and the manufacturing method thereof according to this embodiment, substrate 3 is made of conductive GaN or conductive SiC.

If GaN is epitaxially grown on the conductive GaN or conductive SiC, a GaN crystal that has a low dislocation density and a high flatness can be produced. Therefore, the dislocation density of epitaxial layer 2a can be lowered, and the flatness thereof can be improved. In addition, if the substrate used is conductive, electrode 11 can be attached to substrate 3, and a current can be injected through substrate 3, so that a current of a high current density can be injected into the active layer.

(Embodiment 2)

Figure 13:
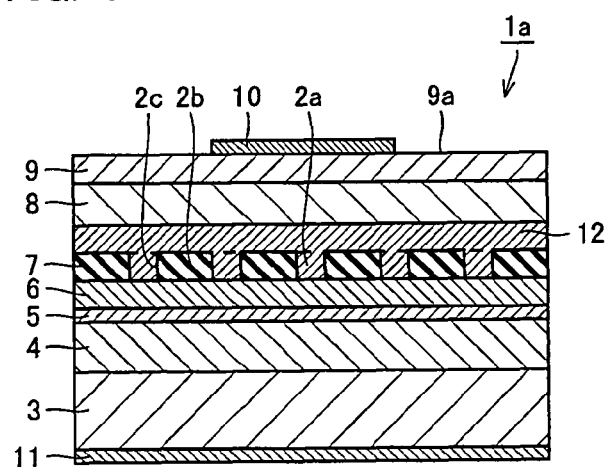
FIG. 13 is a cross-sectional view showing a configuration of a semiconductor laser device according to an embodiment 2 of the present invention.

FIG. 13 is a cross-sectional view showing a configuration of a semiconductor laser device according to an embodiment 2 of the present invention. As shown in FIG. 13, a semiconductor laser device 1a according to this embodiment differs from semiconductor laser device 1 according to the embodiment 1 in configuration of a photonic crystal layer 7. Specifically, a low refractive index material 2b has a plurality of holes 2c, and each of plurality of holes 2c is filled with an epitaxial layer 2a of GaN that constitutes a diffraction grating point. In other words, while the diffraction grating points are made of low refractive index material 2b in semiconductor laser device 1 according to the embodiment 1, the diffraction grating points in semiconductor laser device 1a according to this embodiment are made of epitaxial layer 2a.

The remainder of the configuration of semiconductor laser device 1a is the same as that of semiconductor laser device 1 according to the embodiment 1. Therefore, like components are denoted by like reference symbols, and descriptions thereof will be omitted.

In the following, a manufacturing method of semiconductor laser device 1a according to this embodiment will be described with reference to FIGS. 14 to 18.

Figure 14:
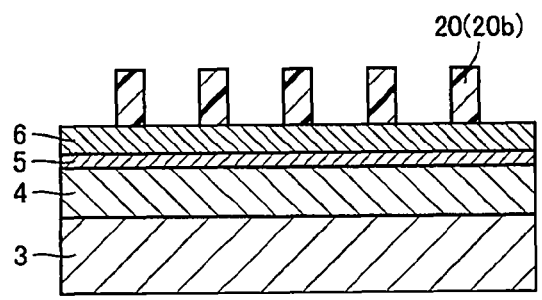
FIG. 14 is a diagram showing a first step of a manufacturing method of the semiconductor laser device according to the embodiment 2 of the present invention.

According to this embodiment, at first, the same manufacturing process as in the embodiment 1 shown in FIG. 7 is followed. Then, referring to FIG. 14, a resist 20 having a predetermined pattern (a patterned layer) is formed on a p-type clad layer 6 by the electron-beam lithography technique. In FIG. 14, resist 20 has a pattern of a plurality of columns 20b arranged in a triangular lattice structure.

Figure 15:
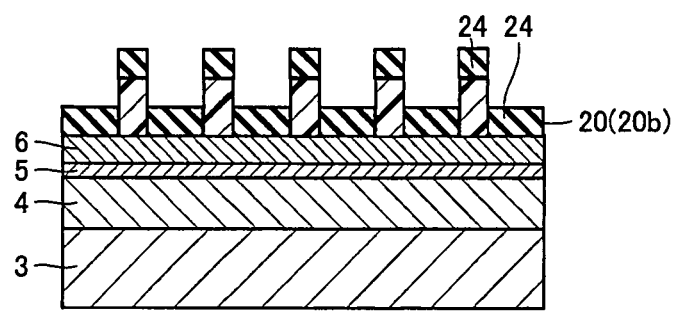
FIG. 15 is a diagram showing a second step of the manufacturing method of the semiconductor laser device according to the embodiment 2 of the present invention.
Figure 16:
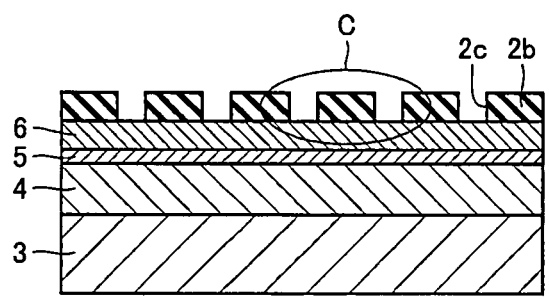
FIG. 16 is a diagram showing a third step of the manufacturing method of the semiconductor laser device according to the embodiment 2 of the present invention.
Figure 17:
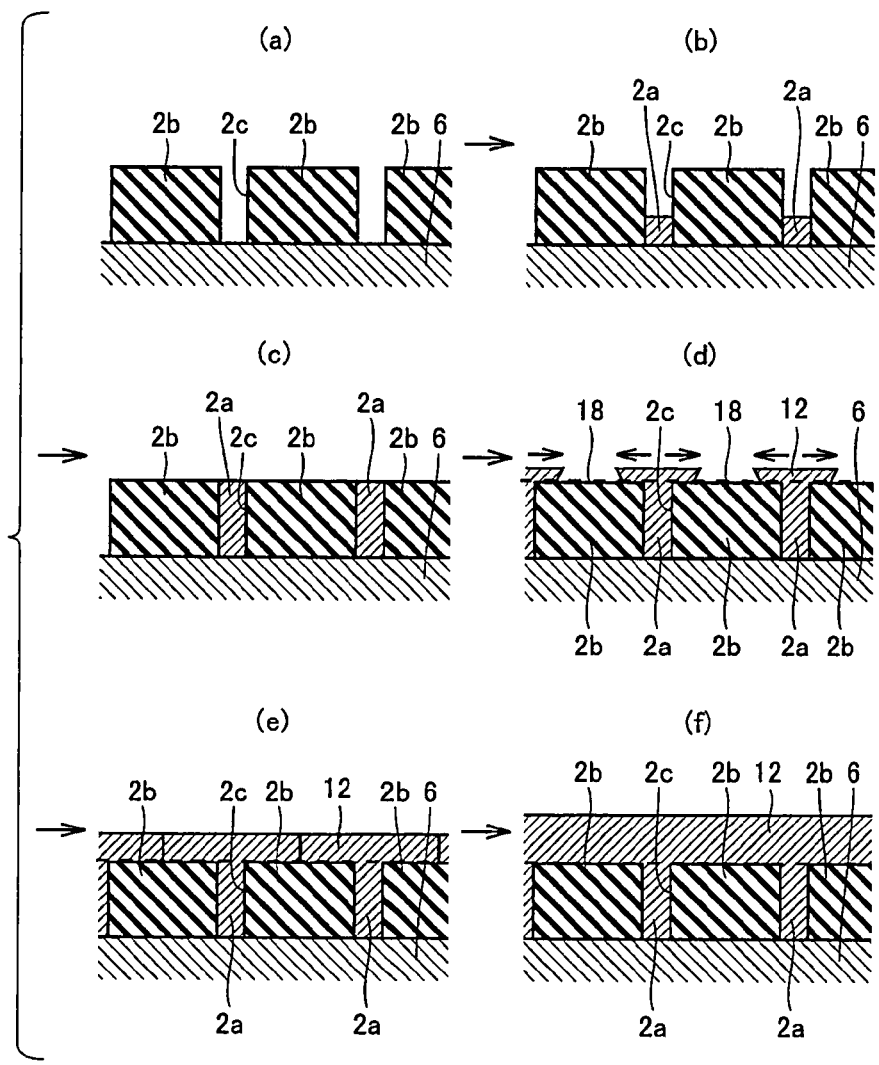

Then, referring to FIG. 15, a film 24 of a low refractive index material is formed on resist 20 by vapor deposition to fill the spaces between plurality of columns 20b with the low refractive index material. Then, referring to FIG. 16, film 24 formed on resist 20 is removed (lifted off) along with resist 20. Thus, low refractive index material 2b having a plurality of holes 2c arranged in a triangular lattice structure is formed on p-type clad layer 6.

Then, the surface of p-type clad layer 6 is cleaned, and then, an epitaxial layer 2a made of GaN and a GaN layer 12 are formed on p-type clad layer 6 by MOCVD. FIGS. 17(a) to 17(f) are schematic diagrams sequentially illustrating the growth of the epitaxial layer according to the embodiment 2 of the present invention. Here, FIG. 17(a) is an enlarged view of a C portion shown in FIG. 16.

Referring to FIGS. 17(a) to 17(f), GaN is epitaxially grown under a condition in which the ratio of a group V material gas to a group III material gas is higher than that in the typical GaN epitaxial growth condition, or in other words, under a condition in which a smaller amount of chlorine gas and a larger amount of ammonia gas are contained. Then, GaN is not epitaxially grown on the top and side surfaces of low refractive index material 2b, but GaN (epitaxial layer 2a) is selectively epitaxially grown only on the surface of p-type clad layer 6 exposed at the bottom of holes 2c ((a)→(b)). GaN is grown upwardly in the drawings to reach the upper end of low refractive index material 2b ((b)→(c)). In this way, a photonic crystal layer 7 is provided that has a structure in which a plurality of holes 2c in low refractive index material 2b are filled with the epitaxial layer.

Figure 18:
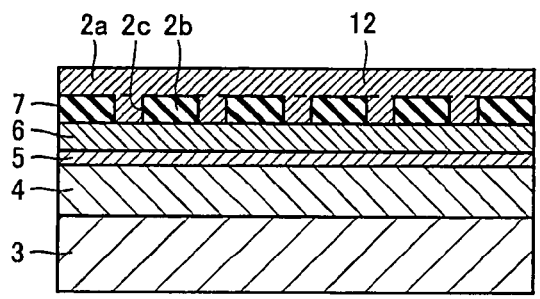
FIG. 18 is a diagram showing a fifth step of the manufacturing method of the semiconductor laser device according to the embodiment 2 of the present invention.

Once reached the upper end of low refractive index material 2b, GaN (GaN layer 12) is grown in a region 18 directly on low refractive index material 2b in a horizontal direction in the drawings ((c)→(d)→(e)). The direction of growth of GaN layer 12 is along a principal plane 3a of substrate 3 (FIG. 13). Then, once region 18 directly on low refractive index material 2b is completely covered with GaN layer 12, GaN layer 12 is grown upwardly in the drawings again ((e)→(f)). In this way, GaN layer 12 is formed. FIG. 18 shows a state after photonic crystal layer 7 and GaN layer 12 are formed on p-type clad layer 6.

Then, referring to FIG. 13, a p-type clad layer 8 and a contact layer 9 are epitaxially grown on GaN layer 12 in this order by MOCVD, for example. Then, an electrode 10 is formed on a light-emitting surface 9a of contact layer 9, and an electrode 11 is formed on a principal plane 3b of substrate 3, thereby completing semiconductor laser device 1a.

Semiconductor laser device 1a according to this embodiment can provide the same effect as semiconductor laser device 1 according to the embodiment 1.

In semiconductor laser device 1a according to this embodiment, since the diffraction grating points are made of epitaxial layer 2a, nonradiative recombination of carriers at the interfaces between low refractive index material 2b and the diffraction grating points is hard to occur compared with the case where the diffraction grating points are made of air. Therefore, the property of the semiconductor laser device can be improved.

Furthermore, in semiconductor laser device 1a according to this embodiment, since the diffraction grating points are made of epitaxial layer 2a, unlike the case where the diffraction grating points are made of air, moisture or other impurities in the air can be prevented from entering the inside of the device or remaining in the device. Therefore, the reliability of the semiconductor laser device can be improved.

In semiconductor laser device 1a according to this embodiment, low refractive index material 2b has a plurality of holes 2c, and plurality of holes 2c are filled with epitaxial layer 2a to form the diffraction grating points.

In the manufacturing method of semiconductor laser device 1a according to this embodiment, resist 20 has a pattern of a plurality of columns 20b.

Thus, photonic crystal layer 7 that has diffraction grating points constituted by the columns of epitaxial layer 2a can be provided, and the semiconductor laser device that oscillates light by establishing a standing wave of light of the TM mode can be provided.

(Embodiment 3)

Figure 19:
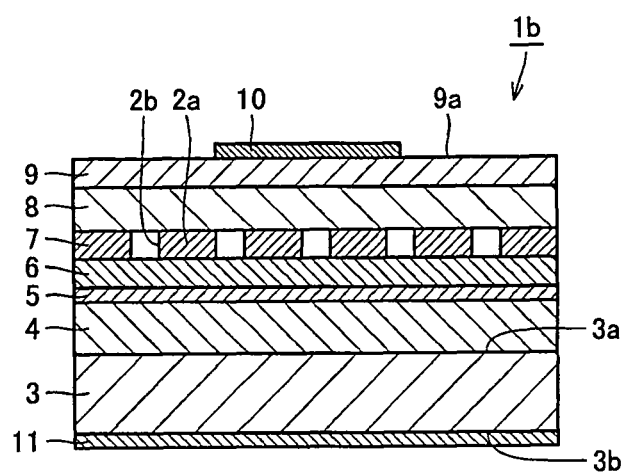
FIG. 19 is a cross-sectional view showing a configuration of a semiconductor laser device according to an embodiment 3 of the present invention.

FIG. 19 is a cross-sectional view showing a configuration of a semiconductor laser device according to an embodiment 3 of the present invention. As shown in FIG. 19, a semiconductor laser device 1b according to this embodiment differs from semiconductor laser device 1 according to the embodiment 1 in configuration of a photonic crystal layer 7 (two-dimensional diffraction grating). Specifically, an epitaxial layer 2a has a plurality of holes 2b arranged in a triangular lattice structure, and each of plurality of holes 2b is filled with nothing. In other words, in semiconductor laser device 1b according to this embodiment, the diffraction grating points are made of air. In addition, no GaN layer 12 is formed, and a p-type clad layer 8 is formed directly on a photonic crystal layer 7.

The remainder of the configuration of semiconductor laser device 1b is the same as that of semiconductor laser device 1 according to the embodiment 1. Therefore, like components are denoted by like reference symbols, and descriptions thereof will be omitted.

Figure 20:
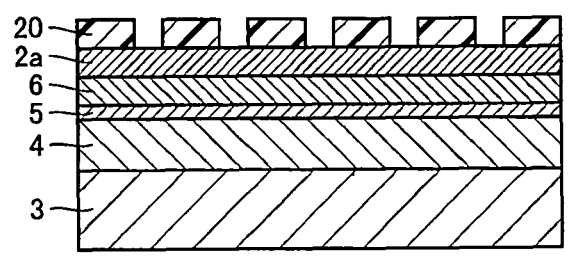
FIG. 20 is a diagram showing a first step of a manufacturing method of the semiconductor laser device according to the embodiment 3 of the present invention.

In the following, a manufacturing method of semiconductor laser device 1b according to this embodiment will be described with reference to FIGS. 20 to 22.

According to this embodiment, at first, the same manufacturing process as in the embodiment 1 shown in FIG. 7 is followed. Then, referring to FIG. 20, an epitaxial layer 2a of GaN is formed on a p-type clad layer 6. Then, a resist material is applied to epitaxial layer 2a using a spin coater, for example, and the resist material is patterned using an electron beam (EB) exposure apparatus. Thus, a resist 20 having a predetermined shape is formed on epitaxial layer 2a by the electron-beam lithography technique.

Figure 21A:
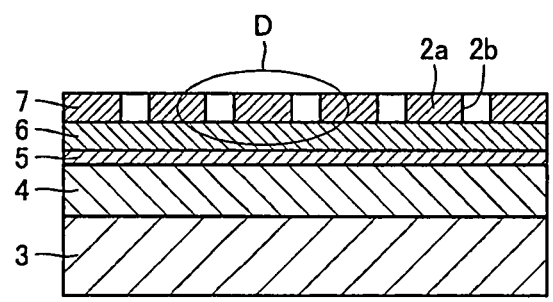
FIG. 21A is a diagram showing a second step of the manufacturing method of the semiconductor laser device according to the embodiment 3 of the present invention.
Figure 21B:
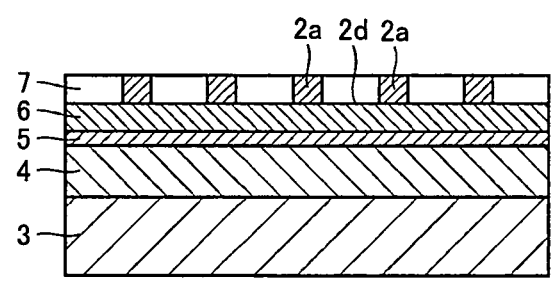
FIG. 21B is a diagram showing an alternative second step of the manufacturing method of the semiconductor laser device according to the embodiment 3 of the present invention.
Figure 22:
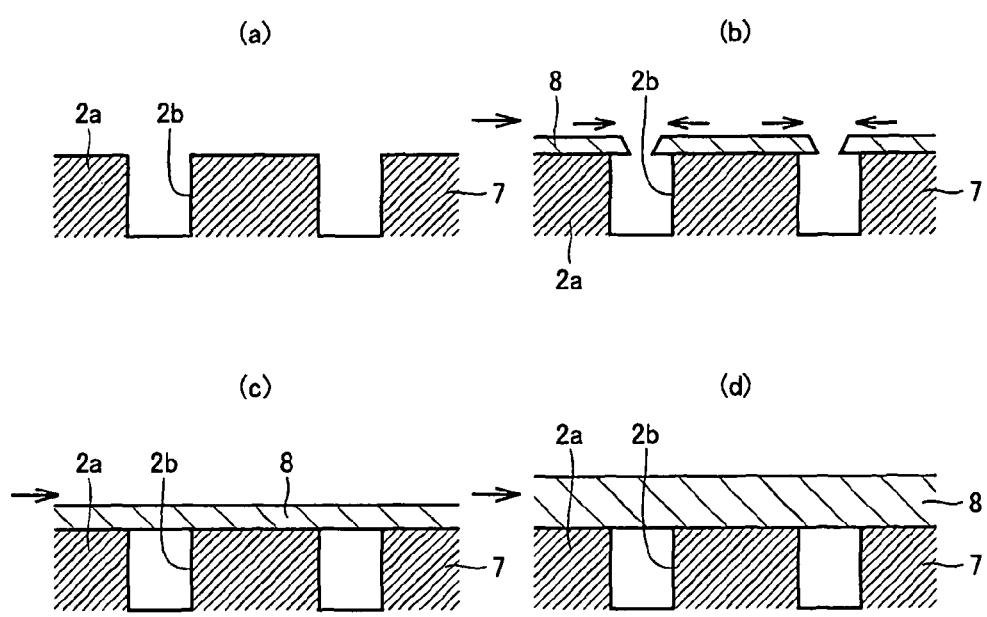

Then, referring to FIG. 21A, epitaxial layer 2a is etched by ICP reactive ion etching (RIE) using resist 20 (FIG. 20) as a mask, thereby forming a plurality of holes 2b, which constitute diffraction grating points, at predetermined positions on epitaxial layer 2a. In this way, epitaxial layer 2a is formed on a photonic crystal layer 7.

Instead of forming photonic crystal layer 7 described above, as shown in FIG. 21B, epitaxial layer 2a may be shaped into photonic crystal layer 7 by shaping epitaxial layer 2a into a plurality of columns. In this case, a groove 2d is formed between the plurality of columns by etching.

Then, resist 20 is removed, and the surface of photonic crystal layer 7 is cleaned. After that, a p-type clad layer 8 made of GaN, for example, is formed on photonic crystal layer 7 by MOCVD. FIGS. 22(a) to 22(d) are schematic diagrams sequentially illustrating the growth of the p-type clad layer according to the embodiment 3 of the present invention. Here, FIG. 22(a) is an enlarged view of a D portion shown in FIG. 21A.

Referring to FIGS. 22(a) to (d), AlGaN is epitaxially grown under a condition in which the growth temperature is higher than that in the typical GaN epitaxial growth condition, that is, under a condition in which a small amount of chlorine-based gas is introduced. Then, although epitaxial layer 2a has been grown upwardly in the drawings (in a (0001) direction (C-plane growth), for example), AlGaN (p-type clad layer 8) formed on epitaxial layer 2a is grown in a horizontal direction in the drawings (in a (112-2) direction (R-plane direction), for example) ((a)→(b)→(c)). GaN is grown along a principal plane 3a (FIG. 19) of substrate 3 in a region directly above each of plurality of holes 2b. AlGaN is slightly grown in holes 2b. However, holes 2b are not completely filled with the AlGaN.

Then, once the regions directly above holes 2b are completely covered with AlGaN, AlGaN is grown upwardly in the drawings again ((c)→(d)). In this way, p-type clad layer 8 of AlGaN is formed.

Here, in order to grow the layer (p-type clad layer 8 in the drawings) covering photonic crystal layer 7 horizontally in the drawings as shown in FIGS. 22(a) to 22(c), the layer covering photonic crystal layer 7 preferably contains any of Ga, In and Al and N. In addition, in order to grow the layer covering photonic crystal layer 7 horizontally in the drawings, the layer covering photonic crystal layer 7 is formed at an ambient pressure that is equal to or lower than 70 kPa, or preferably, equal to or lower than 60 kPa. In addition, in order to prevent a layer having the same composition as the layer covering photonic crystal layer 7 from being grown on the side faces of holes 2b, the layer covering photonic crystal layer 7 is formed at an ambient pressure that is equal to or higher than 10 kPa, or preferably, equal to or higher than 30 kPa.

Then, referring to FIG. 19, a contact layer 9 is epitaxially grown on p-type clad layer 8 by MOCVD, for example. Then, an electrode 10 is formed on a light-emitting surface 9a of contact layer 9, and an electrode 11 is formed on a principal plane 3b of substrate 3, thereby completing semiconductor laser device 1b.

The manufacturing method of semiconductor laser device 1b according to this embodiment includes the following steps. An n-type clad layer 4, an active layer 5, and the p-type clad layer 6 are grown epitaxially on substrate 3 in this order. Epitaxial layer 2a of GaN is formed on substrate 3. Epitaxial layer 2a is shaped into photonic crystal layer 7. P-type clad layer 8 containing GaN is grown along a principal plane of substrate 3 in the region directly on photonic crystal layer 7.

According to the manufacturing method of semiconductor laser device 1b according to this embodiment, p-type clad layer 8 containing GaN is grown along principal plane 3a of substrate 3 in the region directly on photonic crystal layer 7. In this way, photonic crystal layer 7 and p-type clad layer 8 covering photonic crystal layer 7 are formed. That is, the layer can be formed directly on photonic crystal layer 7 without fusion. Thus, the semiconductor laser device can be manufactured without fusion.

In addition, compared with the case of fusion, the adhesion between photonic crystal layer 7 and p-type clad layer 8 on photonic crystal layer 7 is improved, so that moisture or other impurities in the air can be prevented form entering the inside of the device. Therefore, the reliability of the semiconductor laser device can be improved.

In the manufacturing method described above, when forming photonic crystal layer 7, a plurality of holes 2b are preferably formed in epitaxial layer 2a.

Thus, photonic crystal layer 7 is provided that has diffraction grating points constituted by a plurality of holes 2b, and the semiconductor laser device that oscillates light by establishing a standing wave of light of the TE mode can be provided.

In the manufacturing method described above, when forming photonic crystal layer 7, epitaxial layer 2a is preferably shaped into a plurality of columns.

Thus, photonic crystal layer 7 that has diffraction grating points constituted by a plurality of columns of epitaxial layer 2a can be provided, and the semiconductor laser device that oscillates light by establishing a standing wave of light of the TM mode can be provided.

In the manufacturing method described above, p-type clad layer 8 is preferably formed by MOCVD. In addition, p-type clad layer 8 is formed at an ambient pressure that is equal to or higher than 10 kPa and equal to or lower than 70 kPa, or preferably, equal to or higher than 30 kPa and equal to or lower than 60 kPa. This facilitates the growth of p-type clad layer 8 along the principal plane of the substrate.

(Embodiment 4)

With regard to the embodiments 1 to 3, a case where diffraction grating points 2b of photonic crystal layer 7 are arranged in a triangular lattice structure as shown in FIG. 3 has been described. However, the diffraction grating points of photonic crystal layer 7 may be arranged as described below, for example.

Figure 23:
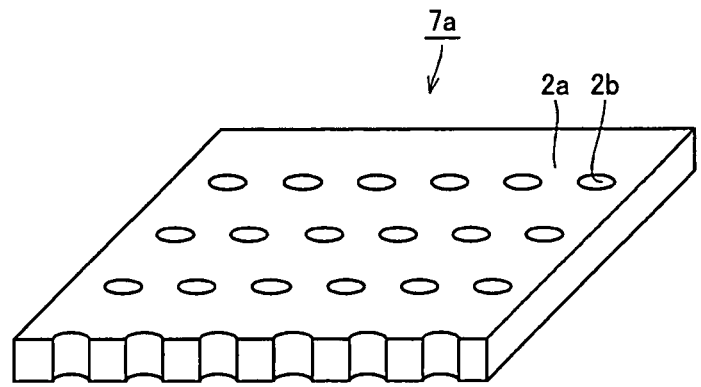
FIG. 23 is a perspective view showing a configuration of a photonic crystal layer according to an embodiment 4 of the present invention.

FIG. 23 is a perspective view showing a configuration of a photonic crystal layer according to an embodiment 4 of the present invention. As shown in FIG. 23, in a photonic crystal layer 7a according to this embodiment, a plurality of diffraction grating points 2b are formed on one surface of an epitaxial layer 2a to form a square lattice.

Figure 24:
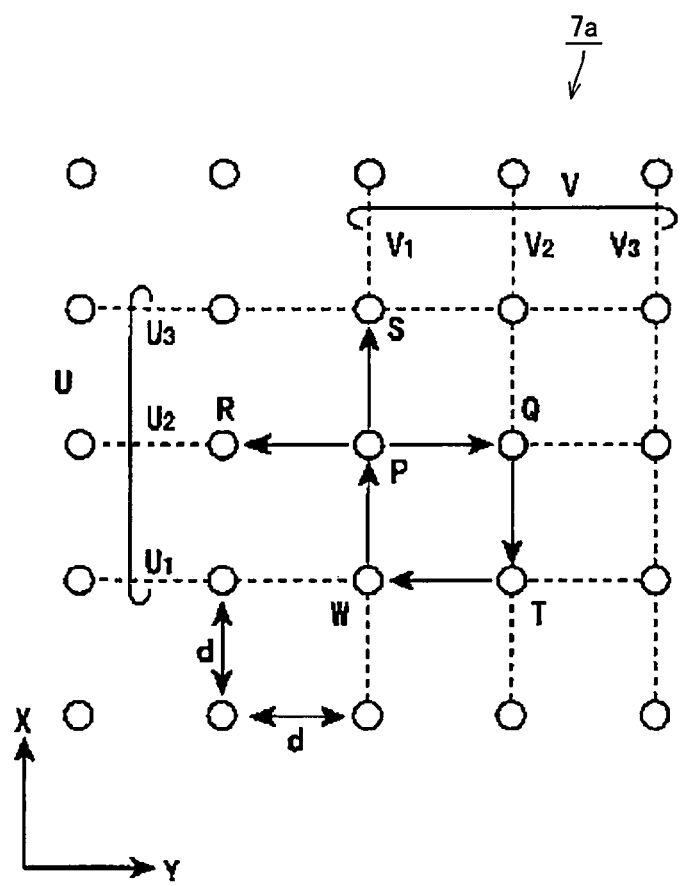
FIG. 24 is a diagram showing a square lattice having a lattice constant of "d" that serves as a two-dimensional diffraction grating.

FIG. 24 is a diagram showing a square lattice having a lattice constant of "d" that serves as a two-dimensional diffraction grating. The square lattice is filled with squares whose sides have a length of "d". In FIG. 24, a lattice point W is arbitrarily selected, and the direction from lattice point W toward a lattice point P is referred to as X-Γ direction, and the direction from lattice point W toward a lattice point Q is referred to as X-J direction. With regard to this embodiment, a case where the wavelength of the light emitted in an active layer 5 corresponds with the period of the lattice in X-Γ direction will be described.

Two-dimensional diffraction grating (photonic crystal layer) 7a can be considered to include two one-dimensional diffraction grating groups U and V described below. One-dimensional diffraction grating group U is composed of one-dimensional gratings $U_1, U_2, U_3$ and the like that are arranged in the Y-axis direction. One-dimensional diffraction grating group V is composed of one-dimensional gratings $V_1, V_2, V_3$ and the like that are arranged in the X-axis direction. These two one-dimensional diffraction grating groups U and V match with each other if rotated 90 degrees about any lattice point. In each of one-dimensional diffraction grating groups U and V, the distance between adjacent two one-dimensional gratings is "d", and the distance between adjacent two lattice points in each one-dimensional grating is also "d".

First, grating group U will be considered. Light traveling in a direction from lattice point W to lattice point P is diffracted at lattice point P. As in the case of the triangular lattice, the direction of diffraction is defined by the Bragg condition $2d^*\sin\theta=m\lambda$ (m=0, ±1, ...). In the case where the diffraction grating is configured to provide the second-order Bragg reflection (m=±2), there exist other lattice points Q and R at positions where θ=±90 degrees and lattice points W and S at positions where θ=0 degrees and 180 degrees, which correspond to a case where m=0.

Light diffracted at lattice point P toward lattice point Q is diffracted according to the rule in grating group V. This diffraction can be considered in the same manner as the diffraction according to the rule in grating group U. Then, light diffracted at lattice point Q toward a lattice point T is diffracted according to the rule in grating group U. In this way, light is diffracted successively. Light diffracted lattice point T toward lattice point W is diffracted according to rule in grating group V.

As described above, the light traveling from lattice point W to lattice point P reaches initial lattice point W after a plurality of diffractions. Thus, in the semiconductor laser device according to this embodiment, since light traveling in a certain direction returns to the position of the initial lattice point after a plurality of diffractions, standing waves are established between the lattice points. Therefore, two-dimensional diffraction grating 7a serves as an optical resonator, that is, a wavelength selector and a reflector.

Furthermore, in the Bragg condition $2d^*\sin\theta=m\lambda$ (m=0, ±1, ...), if "m" is an odd number, Bragg reflection occurs in directions of θ=±90 degrees. This means that strong diffraction occurs also in a direction perpendicular to the principal plane of two-dimensional diffraction grating 7a (a direction perpendicular to the plane of sheet of FIG. 15). Thus, light can be emitted in a direction perpendicular to the principal plane of two-dimensional diffraction grating 7a, that is, can be emitted from a light-emitting surface 9a (FIG. 1) (surface emission can be achieved).

Furthermore, in two-dimensional diffraction grating 7a, taking into account the fact that lattice point W at which the phenomenon described above occurs is arbitrarily chosen, the light diffraction described above can occur at all the lattice points arranged two-dimensionally. Therefore, it can be considered that rays of light propagating in X-Γ directions of the respective grating groups are two-dimensionally combined to each other by Bragg diffraction. It can be considered that, in two-dimensional diffraction grating 7a, three X-Γ directions are combined by such two-dimensional combination to provide a coherent state.

The remainder of the configuration of the semiconductor laser device and the manufacturing method thereof is substantially the same as the configurations of semiconductor laser devices 1, 1a and 1b and the manufacturing methods thereof according to the embodiments 1, 2 and 3. Therefore, like parts are denoted by like reference symbols, and descriptions thereof will be omitted.

The semiconductor laser device according to this embodiment can provide the same effect as semiconductor laser devices 1, 1a and 1b according to the embodiments 1, 2 and 3.

(Embodiment 5)

With regard to the embodiments 1 to 3, a case where a photonic crystal layer 7 is formed in contact with a p-type clad layer 6 formed on an active layer 5 as shown in FIG. 1, for example, has been described. As an alternative to such a configuration, however, a semiconductor laser device according to the present invention may have a configuration shown in FIG. 25, for example.

Figure 25:
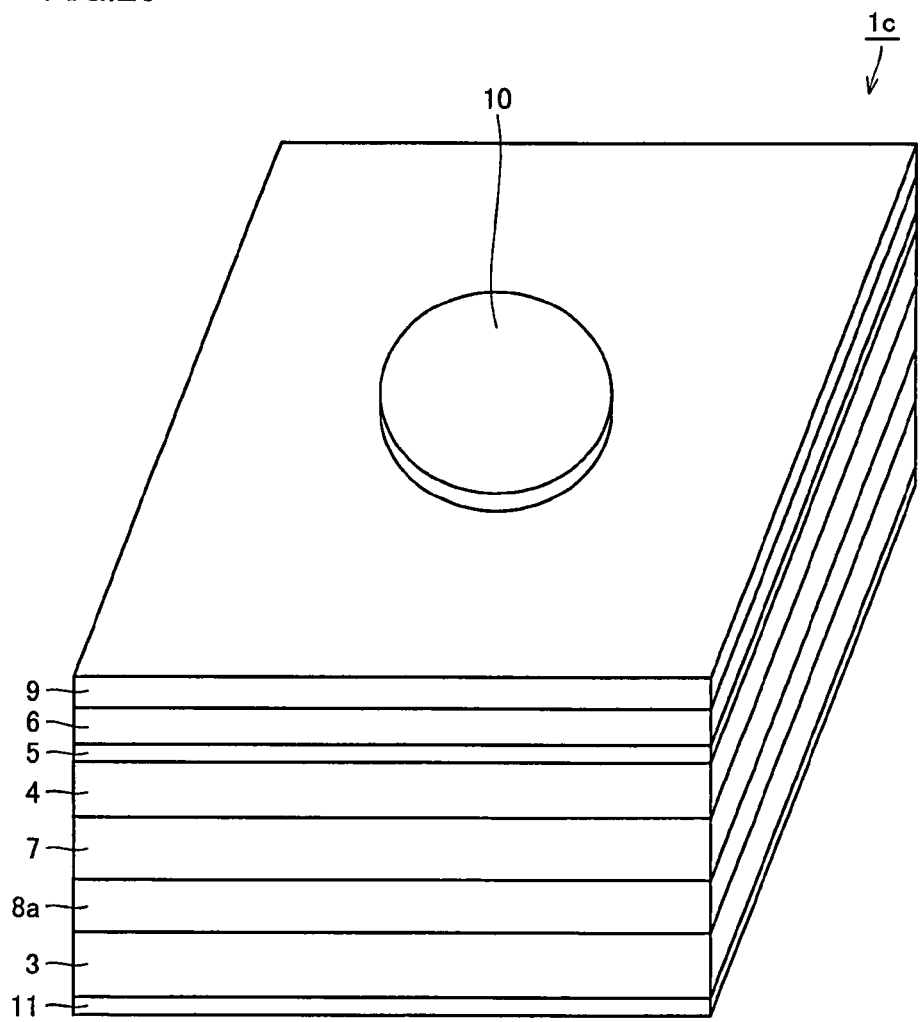
FIG. 25 is a perspective view showing a configuration of a semiconductor laser device according to an embodiment 5 of the present invention.

FIG. 25 is a perspective view showing a configuration of a semiconductor laser device according to an embodiment 5 of the present invention. As shown in FIG. 25, in a semiconductor laser device 1c according to this embodiment, a photonic crystal layer 7 is formed in contact with an n-type clad layer 4 formed under an active layer 5. In other words, in semiconductor laser device 1c according to this embodiment, an n-type clad layer 8a, photonic crystal layer 7, n-type clad layer 4, active layer 5, a p-type clad layer 6 and a contact layer 9 are formed on a substrate 3 in this order. When making semiconductor laser device 1c oscillate light, a positive voltage is applied to an electrode 10 to inject carriers into active layer 5.

The remainder of the configuration of semiconductor laser device 1c and the manufacturing method thereof is substantially the same as the configurations of semiconductor laser devices 1, 1a and 1b and the manufacturing methods thereof according to the embodiments 1, 2 and 3. Therefore, like parts are denoted by like reference symbols, and descriptions thereof will be omitted.

The semiconductor laser device according to this embodiment can provide the same effect as semiconductor laser devices 1, 1a and 1b according to the embodiments 1, 2 and 3.

(Embodiment 6)

This embodiment is a modification of the manufacturing method of the semiconductor laser device according to the embodiment 3 and will be described with reference to FIGS. 26 to 29.

According to this embodiment, at first, the same manufacturing process as in the embodiment 3 is followed to provide the structure shown in FIG. 20. In FIG. 20, a resist 20 is formed on an epitaxial layer 2a excluding in the region where a plurality of holes 2e are to be formed in the following step.

Figure 26:
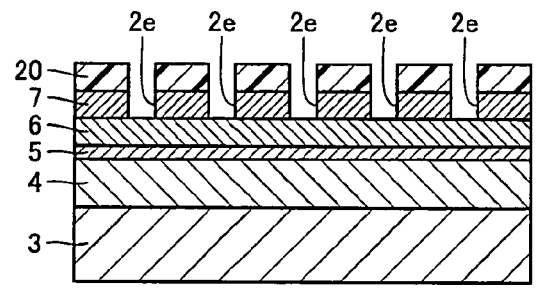
FIG. 26 is a diagram showing a first step of a manufacturing method of a semiconductor laser device according to an embodiment 6 of the present invention.

Then, referring to FIG. 26, epitaxial layer 2a is etched by ICP-RIE using resist 20 as a mask, thereby forming plurality of holes 2e, which constitute diffraction grating points, in epitaxial layer 2a at predetermined positions. In this way, epitaxial layer 2a is shaped into a photonic crystal layer 7.

Figure 27A:
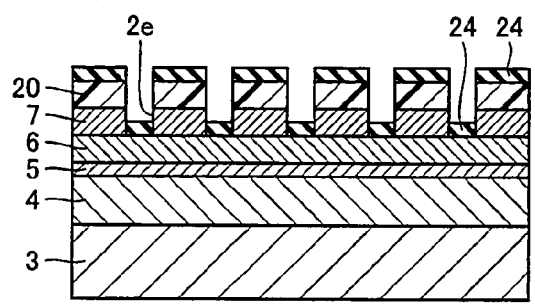
FIG. 27A is a diagram showing a second step of the manufacturing method of the semiconductor laser device according to the embodiment 6 of the present invention.

Then, referring to FIG. 27A, a film (dielectric film) 24 made of a low refractive index material is formed on the bottom of plurality of holes 2e and resist 20 by vapor deposition, for example. Then, referring to FIG. 28, film 24 formed on resist 20 is removed (lifted off) along with resist 20. In this way, low refractive index material 2b is deposited only on the bottom of plurality of holes 2e. In the case where low refractive index material 2b is deposited only on the bottom of plurality of holes 2e as in the structure shown in FIG. 27A, low refractive index material 2b and the air filling the space in holes 2e in which the low refractive index material is not deposited serve as diffraction grating points.

Figure 27B:
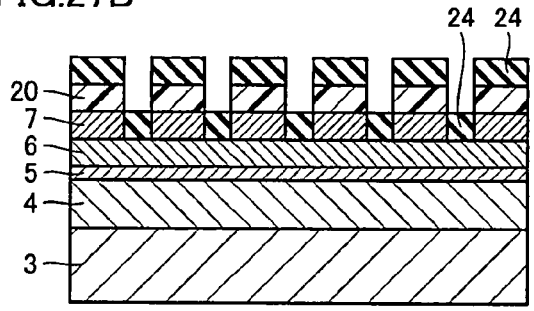
FIG. 27B is a diagram showing a modification of the second step of the manufacturing method of the semiconductor laser device according to the embodiment 6 of the present invention.
Figure 28:
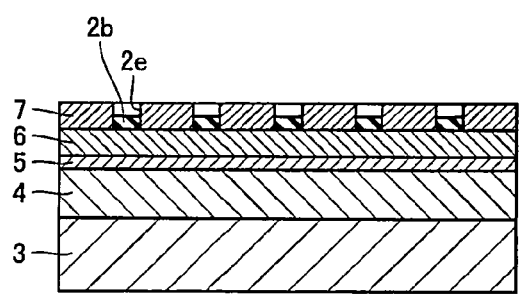
FIG. 28 is a diagram showing a third step of the manufacturing method of the semiconductor laser device according to the embodiment 6 of the present invention.

Here, instead of depositing low refractive index material 24 on the bottom of plurality of holes 2e as shown in FIG. 27, low refractive index material 24 may be deposited to completely fill the interior of plurality of holes 2e as shown in FIG. 27B. In this case, low refractive index material 2b serves as the diffraction grating points.

Figure 29:
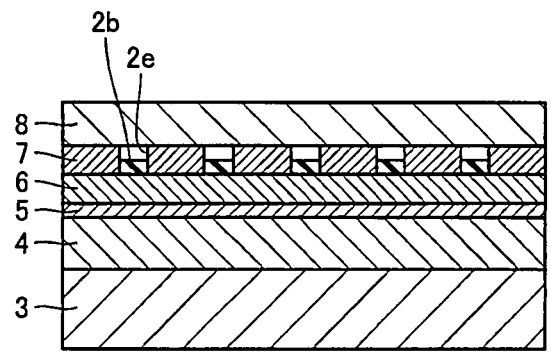
FIG. 29 is a diagram showing a fourth step of the manufacturing method of the semiconductor laser device according to the embodiment 6 of the present invention.

Then, referring to FIG. 29, the surface of photonic crystal layer 7 is cleaned, and then, a p-type clad layer 8 made of GaN is formed on photonic crystal layer 7 by MOCVD, for example. P-type clad layer 8 is grown along a principal plane 3a of a substrate 3 directly above plurality of holes 2e according to the same principle as described with reference to FIGS. 22(a) to 22(d).

Here, in order to grow the layer (p-type clad layer 8 in the drawings) covering photonic crystal layer 7 horizontally in the drawings as shown in FIGS. 22(a) to 22(c), the layer covering photonic crystal layer 7 preferably contains any of Ga, In and Al and N. In addition, in order to grow the layer covering photonic crystal layer 7 horizontally in the drawings, the layer covering photonic crystal layer 7 is formed at an ambient pressure that is equal to or lower than 90 kPa, or preferably, equal to or lower than 70 kPa. If low refractive index material 2b is deposited in holes 2b, the layer covering photonic crystal layer 7 can be easily grown horizontally in the drawings at an ambient pressure close to atmospheric pressure, compared with the case where the low refractive index material is not deposited in the holes as in the embodiment 3. In addition, in order to suppress a layer made of the same material as the layer covering photonic crystal layer 7 from being grown on the side faces of holes 2b, the layer covering photonic crystal layer 7 is formed at an ambient pressure that is equal to or higher than 10 kPa, or preferably, equal to or higher than 30 kPa.

While a case where p-type clad layer 8 is formed directly on photonic crystal layer 7 has been illustrated with regard to this embodiment, a GaN layer 12 (FIG. 1) may be formed directly on photonic crystal layer 7, and p-type clad layer 8 may be formed on GaN layer 12.

Then, referring to FIG. 19, a contact layer 9 is epitaxially grown on p-type clad layer 8 by MOCVD, for example. Then, an electrode 10 is formed on a light-emitting surface 9a of contact layer 9, and an electrode 11 is formed on a principal plane 3b of substrate 3, thereby completing a semiconductor laser device that has substantially the same structure as semiconductor laser device 1b. The semiconductor laser device according to this embodiment differs from semiconductor laser device 1b shown in FIG. 19 in that low refractive index material 2b is deposited in holes 2e to fill a part or the whole of the interior thereof.

The manufacturing method of the semiconductor laser device according to this embodiment includes the following steps. An n-type clad layer 4, an active layer 5, and a p-type clad layer 6 are grown epitaxially on substrate 3 in this order. Epitaxial layer 2a made of GaN is formed on substrate 3. A plurality of holes 2e are formed in epitaxial layer 2a. P-type clad layer 8 containing GaN is grown along the principal plane of substrate 3 by MOCVD in a region directly above plurality of holes 2e.

In the manufacturing method of the semiconductor laser device according to this embodiment, p-type clad layer 8 is grown along the principal plane of substrate 3 in the region directly above plurality of holes 2e. In this way, photonic crystal layer 7 and p-type clad layer 8 covering photonic crystal layer 7 are formed. That is, the layer can be formed directly on photonic crystal layer 7 without fusion. Thus, the semiconductor laser device can be manufactured without fusion.

In addition, since p-type clad layer 8 is formed at an ambient pressure that is equal to or lower than 90 kPa, or preferably, equal to or lower than 70 kPa, growth of p-type clad layer 8 along the principal plane of substrate 3 is facilitated, and the region directly above plurality of holes can be easily covered with p-type clad layer 8.

In addition, since p-type clad layer 8 is formed at an ambient pressure that is equal to or higher than 10 kPa, or preferably, equal to or lower than 30 kPa, a layer having the same material as p-type clad layer 8 can be prevented from being grown on the side faces of holes 2e.

In addition, since low refractive index material 2b is deposited in plurality of holes 2e, a layer having the same material as p-type clad layer 8 can be prevented from being grown on the side faces of holes 2e. In addition, the diffraction grating points can be formed by low refractive index material 2b.

Furthermore, since low refractive index material 24 on resist 20 is removed along with the resist, excessive low refractive index material 24 on resist 20 can be removed without any additional step.

While a case where low refractive index material 2b is deposited by vapor deposition has been described with regard to this embodiment, low refractive index material 2b may be deposited by chemical vapor deposition (CVD), instead of vapor deposition. This method will be described below.

Figure 30:
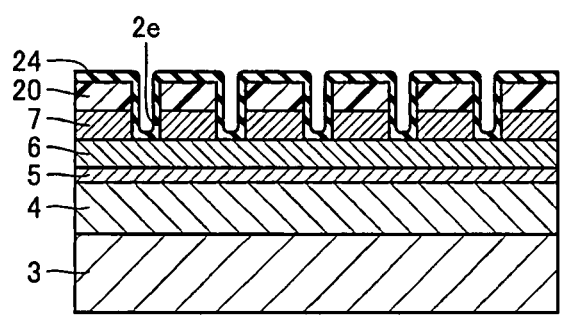
FIG. 30 is a diagram showing a first step of another manufacturing method of the semiconductor laser device according to the embodiment 6 of the present invention.

If, after the structure shown in FIG. 26 is provided, film 24 of low refractive index material is deposited by the CVD method, film 24 is deposited on the top and side surfaces of resist 20 and the side and bottom surfaces of holes 2e as shown in FIG. 30.

Figure 31:
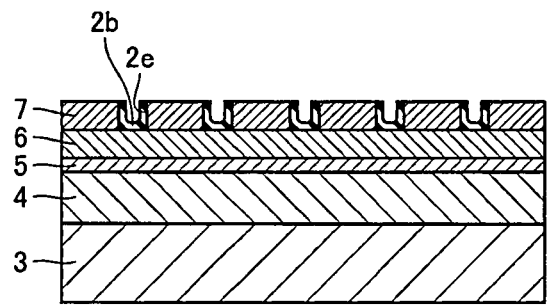
FIG. 31 is a diagram showing a second step of the other manufacturing method of the semiconductor laser device according to the embodiment 6 of the present invention.

Then, referring to FIG. 31, film 24 on the top and side surfaces of resist 20 is removed along with the resist 20 by polishing. As a result, low refractive index material 2b is left on the side and bottom surfaces of holes 2e.

As described above, if the CVD method is used, low refractive index material 2b is deposited on the inner walls of holes 2e. Thus, the entire inner walls of holes 2e can be covered with low refractive index material 2b, so that p-type clad layer 8 can be prevented from being grown in holes 2e.

In the following, examples of the present invention will be described.

EXAMPLE 1

In this example, semiconductor laser devices were fabricated using the manufacturing method according to the embodiment 1. As a substrate 3, a conductive GaN (0001) substrate was prepared. Then, using an MOCVD apparatus, an n-type buffer layer, an n-type clad layer 4 made of AlGaN, an active layer 5 composed of a quantum well of GaInN, and a p-type clad layer 6 made of AlGaN were epitaxially grown in this order on substrate 3. These layers were formed under a growth condition in which the flatness (degree of roughness) of the layer surface is 2 nm or higher in terms of root mean square (RMS) value. The wavelength of the light emitted by the active layer was 410 nm (blue).

Then, substrate 3 was removed from the MOCVD apparatus, a photoresist for electron-beam-exposure (ZEP520) was applied to the surface of p-type clad layer 6 as a resist 20, and a resist pattern of a plurality of holes 20a was drawn using an electron beam exposure apparatus. The resist pattern was a square lattice, in which a pattern of holes 20a having a diameter of 0.09 μm arranged with pitches of 0.17 μm were drawn on resist 20. Then, a film 24 of a low refractive index material 2b, which was one of $SiO_2$, $MgF_2$, $CaF_2$, $BaF_2$ and LiF, was formed on resist 20 to fill plurality of holes 20a. Film 24 was formed to a thickness of 0.1 μm by vacuum deposition. Then, the structure was immersed in a solvent to remove resist 20 and any excessive film 24, thereby forming a plurality of columns of low refractive index material 2b.

Then, using the MOCVD apparatus, under a condition in which the ratio of a group V material gas to a group III material gas was higher than that of the typical growth condition implemented earlier, an epitaxial layer 2a made of p-type GaN and a layer 12 containing GaN were formed. Then, selective layer growth shown in FIGS. 11(a) to 11(f) was observed for all low refractive index materials 2b. After that, a p-type clad layer 8 and a contact layer 9 were formed. Then, substrate 3 was removed from the MOCVD apparatus, a circular p-type ohmic electrode 10 was formed on a light-emitting surface 9a of contact layer 9, and an n-type ohmic electrode 11 was formed over the whole of a principal plane 3b of substrate 3. In this way, semiconductor laser devices 1 were fabricated.

A continuous current was injected to semiconductor laser devices 1 fabricated as described above, and whether laser oscillation occurs or not was checked. As a result, it was confirmed that laser oscillation occurs in all semiconductor laser devices 1 in a threshold current density range of about 4 to 7 $kA/cm^2$. The laser light was emitted from the periphery of circular electrode 10 in a direction perpendicular to principal plane 3a of substrate 3. The polarization characteristic of the laser light was the TE polarization.

EXAMPLE 2

In this example, a semiconductor laser device was fabricated using the manufacturing method according to the embodiment 2. In the same manner as in the example 1, an n-type buffer layer, an n-type clad layer 4 made of AlGaN, an active layer 5 composed of a quantum well of GaInN, and a p-type clad layer 6 made of AlGaN were formed in this order on a substrate 3. Then, a resist 20 was formed on the surface of p-type clad layer 6, and a resist pattern was drawn using an electron beam exposure apparatus. The resist pattern was a square lattice, in which a pattern of a plurality of columns 20b having a diameter of 0.09 μm was drawn on resist 20.

Then, a film 24 of a low refractive index material 2b, which was $MgF_2$, was formed on resist 20 to fill the spaces between plurality of columns 20b. Film 24 was formed to a thickness of 0.1 μm by vacuum deposition. Then, the structure was immersed in a solvent to remove resist 20 and any excessive film 24, thereby providing low refractive index material 2b having a plurality of holes 2c.

Then, in the same manner as in the example 1, an epitaxial layer 2a made of p-type GaN and a layer 12 containing GaN were formed. Then, selective layer growth shown in FIGS. 17(a) to 17(f) was observed. After that, in the same manner as in the example 1, a p-type clad layer 8, a contact layer 9, a p-type ohmic electrode 10 and an n-type ohmic electrode 11 were formed. In this way, semiconductor laser device 1a was fabricated.

A current was injected to semiconductor laser devices 1a fabricated as described above in a continuous energization manner, and whether laser oscillation occurs or not was checked. As a result, it was confirmed that laser oscillation occurs at a threshold current density of about 3.5 kA/cm². The laser light was emitted from the periphery of circular electrode 10 in a direction perpendicular to principal plane 3a of substrate 3. The polarization characteristic of the laser light was the TM polarization.

EXAMPLE 3

In this example, semiconductor laser devices were fabricated using the manufacturing method according to the embodiment 3. In the same manner as in the example 1, an n-type buffer layer, an n-type clad layer 4 made of AlGaN, an active layer 5 composed of a quantum well of GaInN, and a p-type clad layer 6 made of AlGaN were formed in this order on a substrate 3. Then, an epitaxial layer 2a made of p-type GaN was formed on p-type clad layer 6.

Then, a resist 20 was formed on the surface of epitaxial layer 2a, and two kinds of resist patterns were drawn using an electron beam exposure apparatus. One of the resist patterns was a triangular lattice, in which a pattern of a plurality of holes having a diameter of 0.09 μm was drawn on resist 20. The other resist pattern was a triangular lattice, in which a pattern of a plurality of columns having a diameter of 0.11 μm was drawn on resist 20. The pitch was 0.19 μm.

Then, epitaxial layer 2a was etched to a depth of 0.1 μm by the ICP method using the resist patterns as a mask. Then, the resist pattern was removed using an organic solvent. Then, there were provided a photonic crystal layer 7 having a structure in which a plurality of holes 2b were formed in epitaxial layer 2a and a photonic crystal layer having a structure in which a plurality of columns of epitaxial layer 2a were formed.

Then, a p-type clad layer 8 made of GaN was formed on photonic crystal layer 7. Then, selective layer growth shown in FIGS. 22(a) to 22(d) was observed. After that, in the same manner as in the example 1, a contact layer 9, a p-type ohmic electrode 10 and an n-type ohmic electrode 11 were formed. In this way, semiconductor laser devices 1b were fabricated.

A current was injected to semiconductor laser devices 1b fabricated as described above in a continuous energization manner, and whether laser oscillation occurs or not was checked. As a result, it was confirmed that laser oscillation occurs in both semiconductor laser devices 1b at a threshold current density of about 3 kA/cm². The laser light was emitted from the periphery of circular electrode 10 in a direction perpendicular to principal plane 3a of substrate 3. The polarization characteristic of the laser light emitted by semiconductor laser device 1b that has photonic crystal layer 7 having a structure in which holes 2b were formed in epitaxial layer 2a was the TE polarization. The polarization characteristic of the laser light emitted by semiconductor laser device 1b that has photonic crystal layer 7 having a structure in which a plurality of columns of epitaxial layer 2a were formed was the TM polarization.

EXAMPLE 4

With regard to this example, semiconductor laser devices of the structure (columnar structure) shown in FIG. 2 were fabricated by changing the ambient pressure when growing the layer containing GaN in the region directly on the low refractive index material, and the effect of the ambient pressure on the layer containing GaN was examined. Specifically, a plurality of columns of a low refractive index material 2b were formed on a p-type clad layer 6 in the same manner as in the example 1. Then, using an MOCVD apparatus, an epitaxial layer 2a made of p-type GaN and a GaN layer 12 were formed under a condition in which the ratio of a group V material gas to a group III material gas was higher than that in the typical growth condition implemented earlier. When forming GaN layers 12 of semiconductor laser devices, the ambient pressure was kept at atmospheric pressure, 90 kPa, 70 kPa and 20 kPa, respectively. Then, the state of resulting GaN layers 12 was observed using an electron microscope. The result is shown in Table 1.

TABLE 1

| | Ambient pressure (kPa) | | | |
|---|---|---|---|---|
| | 20 | 70 | 90 | 101.3 (Atmospheric pressure) |
| State of layer containing GaN | A | A | B | C |

In Table 1, reference character A represents a case where a desired photonic crystal layer was obtained, reference character B represents a case where a desired photonic crystal layer was obtained in a certain region, and reference character C represents a case where a desired photonic crystal layer was obtained only in a small region. Referring to Table 1, at atmospheric pressure, the GaN layer was hard to grow horizontally, and the vertical growth was dominant. Thus, the region directly on the low refractive index material was hard to cover with GaN layer 12. To the contrary, at pressures equal to or lower than 90 kPa, the GaN layer easily grow horizontally, and at pressures equal to or lower than 70 kPa, the region directly on the low refractive index material was completely covered with the GaN layer.

Figure 32:
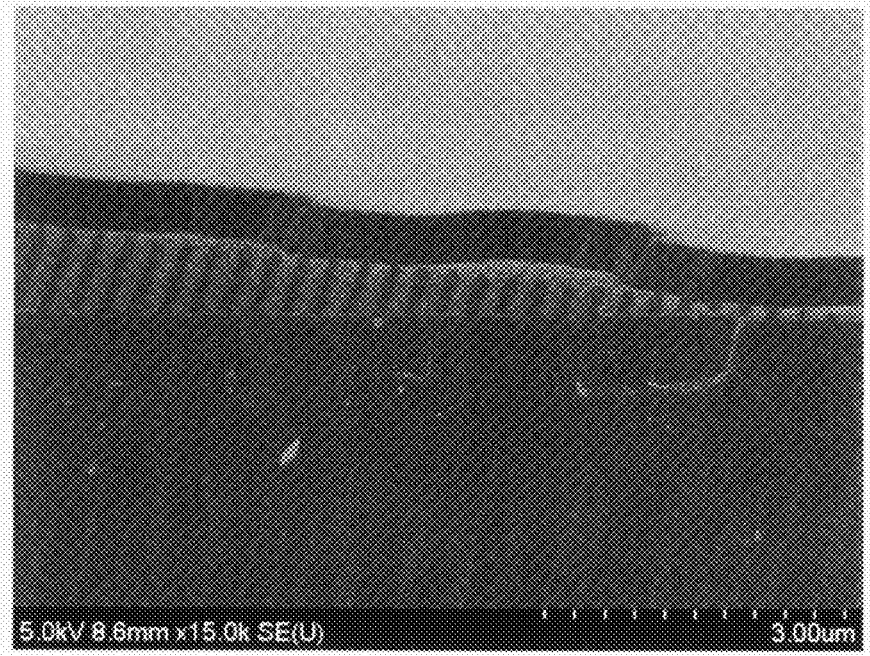
FIG. 32 is a microscope photograph showing a state of a photonic crystal layer in the case where the ambient pressure is kept at atmospheric pressure in an example 4 of the present invention.
Figure 33:
FIG. 33 is a microscope photograph showing a state of a photonic crystal layer in the case where the ambient pressure is kept at 20 kPa in the example 4 of the present invention.

FIG. 32 shows a microscope photograph showing a state of the photonic crystal layer in the case where the ambient pressure was kept at atmospheric pressure, and FIG. 33 shows a microscope photograph showing a state of the photonic crystal layer in the case where the ambient pressure was kept at 20 kPa. In FIG. 32, a cross section of the p-type clad layer and a top surface of the GaN layer can be seen. In the drawing, the part distinguished by oblique lines is low refractive index material 2b arranged in a matrix form. From this microscope photograph, it can be seen that, at atmospheric pressure, a part of the p-type clad layer is not covered with the GaN layer, and the low refractive index material is exposed.

On the other hand, in FIG. 33, cross sections of the p-type clad layer and the low refractive index material, and a top surface of the GaN layer are seen. From this microscope photograph, it can be seen that, at 20 kPa, the p-type clad layer is completely covered with the GaN layer.

EXAMPLE 5

With regard to this example, semiconductor laser devices of the structure (air bridge structure) shown in FIG. 19 were fabricated by changing the ambient pressure when growing the layer containing GaN in the region directly on the low refractive index material, and the effect of the ambient pressure on the layer containing GaN was examined. Specifically, a photonic crystal layer 7 was formed on a p-type clad layer 6 in the same manner as in the example 3. Then, using an MOCVD apparatus, a p-type clad layer 8 made of GaN was formed on photonic crystal layer 7. When forming p-type clad layers 8 of the semiconductor laser devices, the ambient pressure was kept at 70 kPa, 60 kPa, 30 kPa, 20 kPa and 10 kPa, respectively. Then, the state of the resulting photonic crystal layers and p-type clad layers was observed using an electron microscope. The result is shown in Table 2.

TABLE 2

| | Ambient pressure (kPa) | | | | |
|---|---|---|---|---|---|
| | 10 | 20 | 30 | 60 | 70 |
| State of layer containing GaN | B | B | A | A | B |

In Table 2, reference character A represents a case where a desired photonic crystal layer was obtained, and reference character B represents a case where a desired photonic crystal layer was obtained in a certain region. Referring to Table 2, at 70 kPa, the layer containing GaN was hard to grow horizontally, and the vertical growth was dominant. Thus, the region directly on the low refractive index material was hard to cover with the GaN layer 12. Furthermore, at pressures equal to or lower than 20 kPa, the horizontal growth of the GaN layer was excessively promoted, so that the GaN layer was grown also on the inner walls of the holes, and the holes were partially filled with the GaN layer. To the contrary, at pressures equal to or higher than 30 kPa and equal to or lower than 60 kPa, the horizontal growth of the GaN layer was adequately promoted, and a desired photonic crystal layer and a desired p-type clad layer were obtained.

EXAMPLE 6

With regard to this example, according to the method described with regard to the embodiment 6 (the method in which low refractive index material 2b is deposited on bottom of holes 2e), semiconductor laser devices were fabricated by changing the ambient pressure when growing the layer containing GaN in the region directly on the low refractive index material, and the effect of the ambient pressure on the layer containing GaN was examined. Specifically, a photonic crystal layer 7 was formed on a p-type clad layer 6. Then, as shown in FIG. 27A, a low refractive index material is formed on the bottom of plurality of holes 20a. Then a p-type clad layer 8 made of GaN was formed on photonic crystal layer 7 by using an MOCVD apparatus. When forming p-type clad layers 8 of the semiconductor laser devices, the ambient pressure was kept at 90 kPa, 70 kPa, 30 kPa, 20 kPa and 10 kPa, respectively. Then, the state of resulting layers 12 containing GaN was observed using an electron microscope. The result is shown in Table 3.

TABLE 3

| | Ambient pressure (kPa) | | | | |
|---|---|---|---|---|---|
| | 10 | 20 | 30 | 70 | 90 |
| State of layer containing GaN | B | B | A | A | B |

In Table 3, reference character A represents a case where a desired photonic crystal layer was obtained, and reference character B represents a case where a desired photonic crystal layer was obtained in a certain region. Referring to Table 3, at 90 kPa, the GaN layer was hard to grow horizontally, and the vertical growth was dominant. Thus, the region directly on the low refractive index material was hard to cover with the p-type clad layer. Furthermore, at pressures equal to or lower than 20 kPa, the horizontal growth of the GaN layer was excessively promoted, so that the GaN layer was grown also on the inner walls of the holes, and the holes were partially filled with the GaN layer. To the contrary, at pressures equal to or higher than 30 kPa and equal to or lower than 70 kPa, the horizontal growth of the GaN layer was adequately promoted, and a desired photonic crystal layer and a desired p-type clad layer were obtained.

Figure 34:
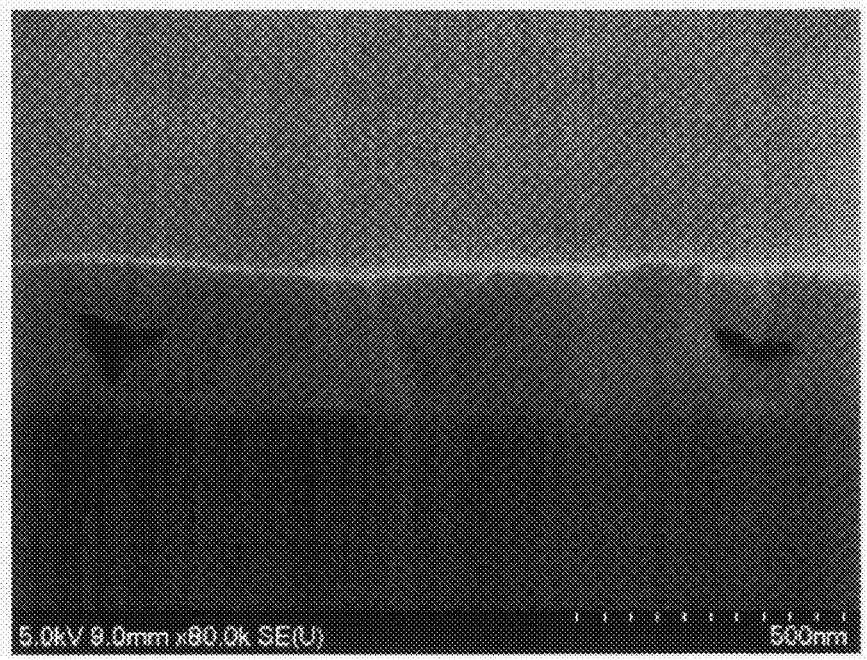
FIG. 34 is a microscope photograph showing a state of a photonic crystal layer in the case where the ambient pressure is kept at 20 kPa in an example 6 of the present invention.
Figure 35:
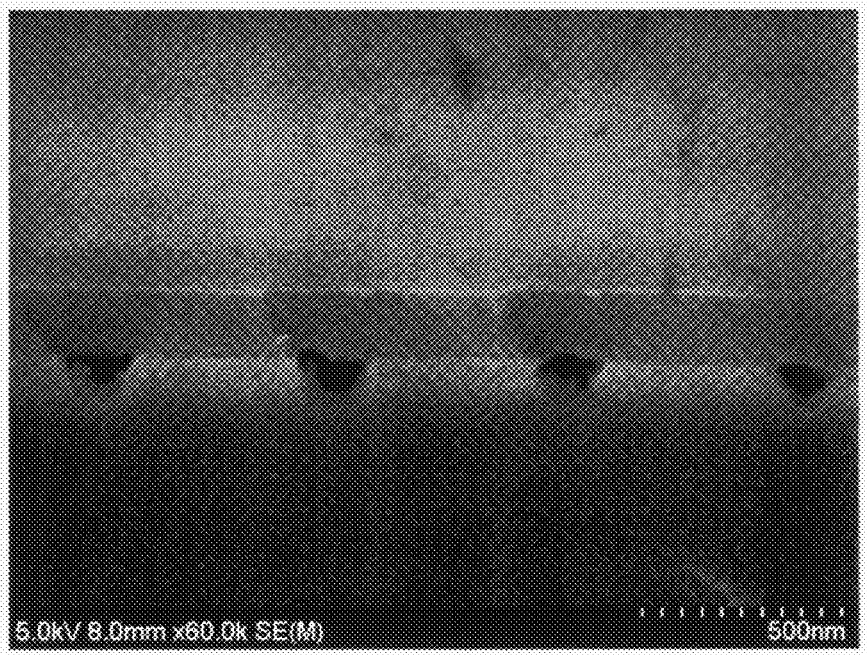
FIG. 35 is a microscope photograph showing a state of a photonic crystal layer in the case where the ambient pressure is kept at 60 kPa in the example 6 of the present invention.

FIG. 34 shows a microscope photograph showing a state of the photonic crystal layer in the case where the ambient pressure was kept at 20 kPa, and FIG. 35 shows a microscope photograph showing a state of the photonic crystal layer in the case where the ambient pressure was kept at 60 kPa. In FIG. 34, the holes in the photonic crystal layer are filled with the layer containing GaN. From this microscope photograph, it can be seen that, at 20 kPa, the holes are partially filled with the GaN layer.

On the other hand, in FIG. 35, the holes in the photonic crystal layer are not filled with the layer containing GaN, and the p-type clad layer is grown horizontally above the holes. From this microscope photograph, it can be seen that, at 60 kPa, the holes are not filled with the GaN layer.

In addition, in this example, a photonic crystal layer whose holes are filled with the low refractive index material $SiO_2$ and a photonic crystal layer whose holes are not filled with the low refractive index material $SiO_2$ were formed at an ambient pressure of 20 kPa, and the appearances thereof were compared with each other. Specifically, a photonic crystal layer formed at an ambient pressure of 20 kPa in the example 5 and a photonic crystal layer formed at an ambient pressure of 20 kPa in this example were observed with a microscope.

Figure 36:
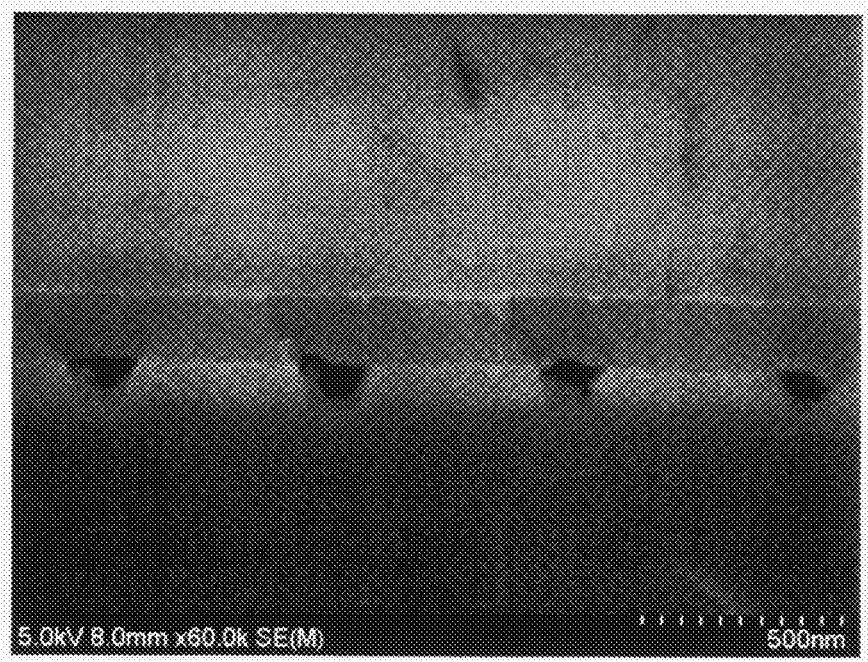
FIG. 36 is a microscope photograph showing a state of a photonic crystal layer in the case where $SiO_2$, which is a low refractive index material, is deposited in holes in the example 6 of the present invention.
Figure 37:
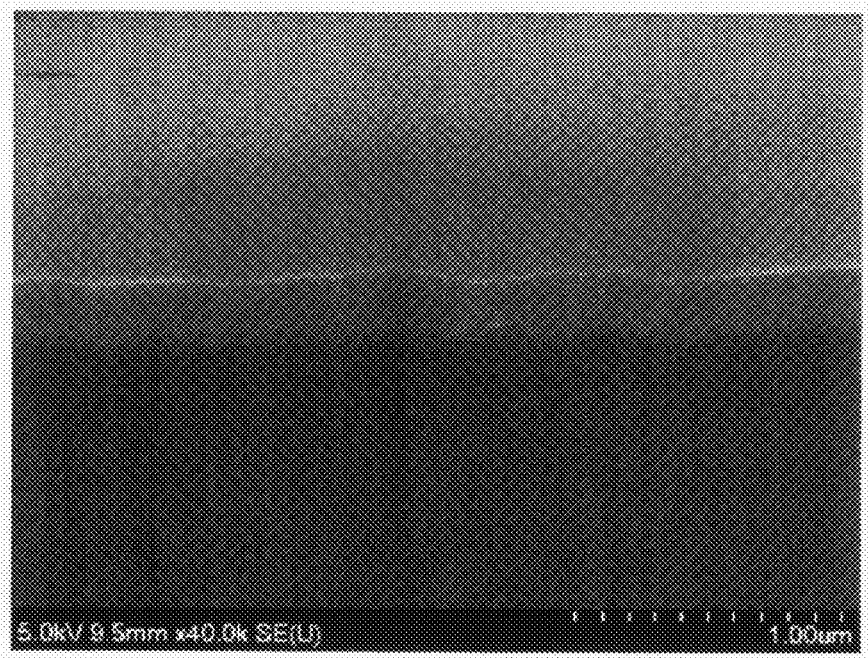
FIG. 37 is a microscope photograph showing a state of a photonic crystal layer in the case where $SiO_2$, which is a low refractive index material, is not deposited in holes in the example 6 of the present invention.

FIG. 36 is a microscope photograph showing a state of the photonic crystal layer in the case where the low refractive index material $SiO_2$ was deposited in the holes, and FIG. 37 is a microscope photograph showing a state of the photonic crystal layer in the case where the low refractive index material $SiO_2$ was not deposited in the holes. Comparing FIGS. 36 and 37, the holes in which the low refractive index material $SiO_2$ is deposited, which are shown in FIG. 36, are harder to fill with the GaN layer. From this fact, it can be seen that depositing the low refractive index material $SiO_2$ in the holes can facilitate formation of a photonic crystal layer of high quality.

The embodiments and examples disclosed above should be construed as illustrative ones, not restrictive ones, in all respects. The scope of the present invention is defined by the following claims not by the embodiments and examples described above, and the present invention is intended to include all modifications and alterations without departing from the spirit and scope of the claims.

What is claimed is:

1. A semiconductor laser device, comprising:
a substrate having a principal plane;
a two-dimensional diffraction grating that is formed on said substrate in a direction in which said principal plane extends and has an epitaxial layer of gallium nitride and a low refractive index material having a refractive index lower than that of said epitaxial layer, wherein said low refractive index material is made of at least one material selected from the group consisting of MgF2, CaF2, BaF2 and LiF, and wherein the diffraction grating has diffraction grating points comprised of a pattern of columns of the low refractive index material or the gallium nitride epitaxial layer, wherein each column includes substantially vertical sidewalls such that a distance between opposite sidewalls of the column is substantially constant along the height of the column;

a first conductive-type clad layer formed on said substrate;

a second conductive-type clad layer formed on said substrate;

an active layer that is interposed between said first conductive-type clad layer and said second conductive-type clad layer and emits light when a carrier is injected thereinto; and a layer containing gallium nitride that covers a region directly on said two-dimensional diffraction grating, wherein said layer containing gallium nitride is grown in a horizontal direction along the principal plane of the substrate directly on the low refractive index material, wherein the epitaxial layer of gallium nitride in the two-dimensional diffraction grating and the layer containing gallium nitride that covers a region directly on the two-dimensional grating form one continuous epitaxial gallium nitride layer.

2. The semiconductor laser device according to claim 1, wherein said epitaxial layer has a plurality of holes, and said plurality of holes are filled with said low refractive index material to form diffraction grating points.

3. The semiconductor laser device according to claim 1, wherein said low refractive index material has a plurality of holes, and said plurality of holes are filled with gallium nitride, which forms said epitaxial layer, to form diffraction grating points.

4. The semiconductor laser device according to claim 1, wherein said substrate is made of conductive gallium nitride or conductive silicon carbide.

* * * * *